United States Patent
Kim et al.

(12) 
(10) Patent No.: US 12,283,576 B2
(45) Date of Patent: Apr. 22, 2025

(54) ELECTRONIC DEVICE INCLUDING THERMAL INTERFACE MATERIAL LAYER AND SEMICONDUCTOR PACKAGE

(71) Applicant: SAMSUNG ELECTRONICS CO., LTD., Suwon-si (KR)

(72) Inventors: Yongha Kim, Seongnam-si (KR); Bonggyu Kang, Yongin-si (KR); Youngsoo Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 309 days.

(21) Appl. No.: 17/713,309

(22) Filed: Apr. 5, 2022

(65) Prior Publication Data

US 2022/0367428 A1   Nov. 17, 2022

(30) Foreign Application Priority Data

May 17, 2021   (KR) .......................... 10-2021-0063200

(51) Int. Cl.
*H01L 25/10*   (2006.01)

(52) U.S. Cl.
CPC .... *H01L 25/105* (2013.01); *H01L 2225/1094* (2013.01)

(58) Field of Classification Search
CPC ........... H01L 25/105; H01L 2225/1094; H01L 23/3675; H01L 23/42; H01L 25/071; H01L 23/3672; H05K 1/0204; H05K 2201/10371; H05K 7/20436; H05K 1/0206; H05K 7/205
See application file for complete search history.

(56) References Cited

U.S. PATENT DOCUMENTS

| | | | |
|---|---|---|---|
| 7,393,419 B2 | 7/2008 | Sachdev et al. | |
| 7,737,550 B2 | 6/2010 | MacQuarrie et al. | |
| 7,960,827 B1 | 6/2011 | Miller, Jr. et al. | |
| 9,343,535 B2 | 5/2016 | Lee et al. | |
| 10,643,924 B1 | 5/2020 | Shen | |
| 2003/0183909 A1 | 10/2003 | Chiu | |
| 2006/0017155 A1 | 1/2006 | Wang | |
| 2008/0116586 A1 | 5/2008 | Kim et al. | |
| 2012/0098119 A1 | 4/2012 | Refai-Ahmed et al. | |
| 2019/0198435 A1 | 6/2019 | Shen et al. | |
| 2020/0183323 A1* | 6/2020 | Shen .................... | G03G 21/185 |
| 2020/0203254 A1 | 6/2020 | Dhane et al. | |
| 2020/0214175 A1 | 7/2020 | Anglin Williams | |
| 2020/0411407 A1 | 12/2020 | Dubey et al. | |

* cited by examiner

*Primary Examiner* — Thanh Y. Tran
(74) *Attorney, Agent, or Firm* — Muir Patent Law, PLLC

(57) ABSTRACT

An electronic device includes a substrate, a first plate having a first internal surface facing a first surface of the substrate, and at least one first through-hole and at least one second through-hole, first and second semiconductor packages spaced apart from each other between the first surface and the first internal surface, a first thermal interface material layer contacting an upper surface of the first semiconductor package and the first internal surface, and filling at least a portion of the at least one first through-hole, and a second thermal interface material layer contacting an upper surface of the second semiconductor package and the first internal surface, and filling at least a portion of the at least one second through-hole. At least one of side surfaces of the first and second thermal interface material layers is exposed to an empty space between the first internal surface and the first surface.

20 Claims, 22 Drawing Sheets

ELECTRONIC DEVICE INCLUDING THERMAL INTERFACE MATERIAL LAYER AND SEMICONDUCTOR PACKAGE

CROSS-REFERENCE TO RELATED APPLICATION

This application claims the benefit under 35 USC 119(a) of Korean Patent Application No. 10-2021-0063200 filed on May 17, 2021, in the Korean Intellectual Property Office, the entire disclosure of which is incorporated herein by reference for all purposes.

BACKGROUND

1. Field

Embodiments relate to an electronic device including a thermal interface material layer and a semiconductor package.

2. Description of the Related Art

In recent years, with the trend of miniaturization and high performance of electronic products, heat generated during operation of electronic products has been increasing. As such, as heat generated by an electronic product gradually increases, it may be difficult to develop a high-performance electronic product.

SUMMARY

According to example embodiments, an electronic device includes a substrate having first and second surfaces opposing each other; a first plate having a first internal surface facing the first surface of the substrate, and a first external surface opposing the first internal surface, the first plate including at least one first through-hole and at least one second through-hole; a first semiconductor package and a second semiconductor package each mounted on the first surface of the substrate, disposed between the first surface of the substrate and the first internal surface of the first plate, and spaced apart from each other; a first thermal interface material layer disposed between the first semiconductor package and the first plate, contacting an upper surface of the first semiconductor package and the first internal surface of the first plate, and filling at least a portion of the at least one first through-hole; and a second thermal interface material layer disposed between the second semiconductor package and the first plate, contacting an upper surface of the second semiconductor package and the first internal surface of the first plate, and filling at least a portion of the at least one second through-hole. At least one of a side surface of the first thermal interface material layer and a side surface of the second thermal interface material layer is exposed to an empty space between the first internal surface of the first plate and the first surface of the substrate.

According to example embodiments, an electronic device includes a substrate having a first surface and a second surface, opposing each other; a first plate having a first internal surface facing the first surface of the substrate, and a first external surface opposing the first internal surface, the first plate including a plurality of front through-holes; a plurality of front semiconductor packages respectively mounted on the first surface of the substrate and spaced apart from each other, between the first surface of the substrate and the first internal surface of the first plate; and a plurality of front thermal interface material layers in contact with the first internal surface of the first plate and each of the plurality of front semiconductor packages, between the plurality of front semiconductor packages and the first internal surface of the first plate. The plurality of front through-holes overlap the plurality of front semiconductor packages, the plurality of front semiconductor packages include a first front semiconductor package and a second front semiconductor package having different thicknesses, the plurality of front through-holes include at least one first front through-hole overlapping the first front semiconductor package and at least one second front through-hole overlapping the second front semiconductor package, the plurality of front thermal interface material layers include a first front thermal interface material layer in contact with the first plate and the first front semiconductor package, and a second front thermal interface material layer in contact with the first plate and the second front semiconductor package, the first plate includes a base region having a base surface located on a first height level from the first surface of the substrate, and a first protruding region having a first protruding surface located at a second height level, lower than the first height level, from the first surface of the substrate, and overlapping the first front semiconductor package, the first internal surface includes the base surface and the first protruding surface, and the first front thermal interface material layer is in contact with the first protruding surface of the first protruding region.

According to example embodiments, an electronic device includes a substrate having a first surface and a second surface opposing each other; a plate having an internal surface facing the first surface of the substrate, and an external surface opposing the internal surface, the plate including at least one through-hole; a semiconductor package overlapping the at least one through-hole and mounted on the first surface of the substrate, between the first surface of the substrate and the internal surface of the plate; and a thermal interface material layer filling at least a portion of the at least one through-hole and in contact with the semiconductor package and the plate. The plate includes a package overlap region overlapping the semiconductor package, the internal surface of the plate includes a first region and a second region, located at different height levels, in the package overlap region, and in contact with the thermal interface material layer, and a side surface of the thermal interface material layer is exposed in an empty space between the internal surface of the plate and the first surface of the substrate.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
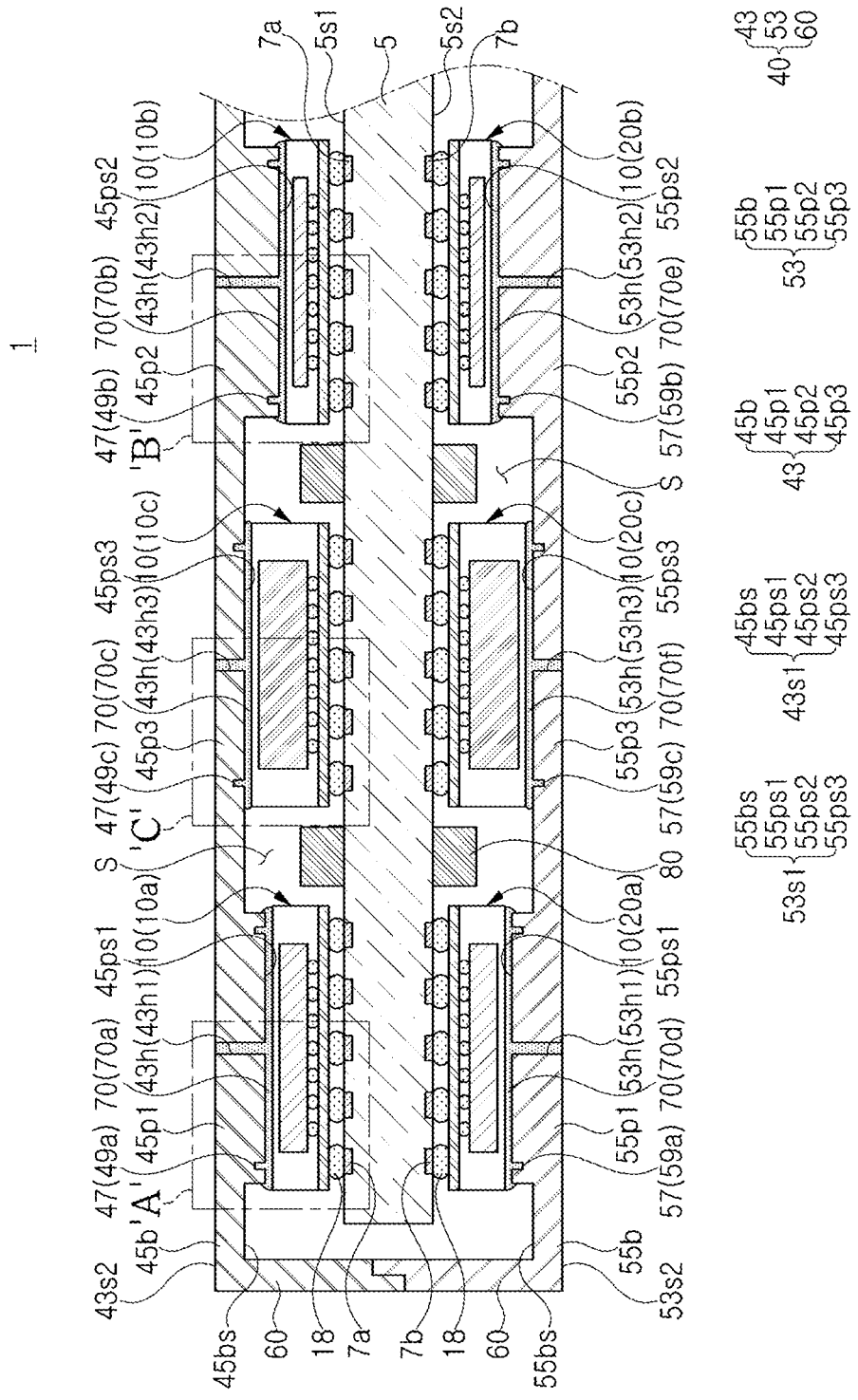
FIGS. 1, 2A, 2B, and 2C are diagrams of an electronic device according to an example embodiment.
Figure 2A:
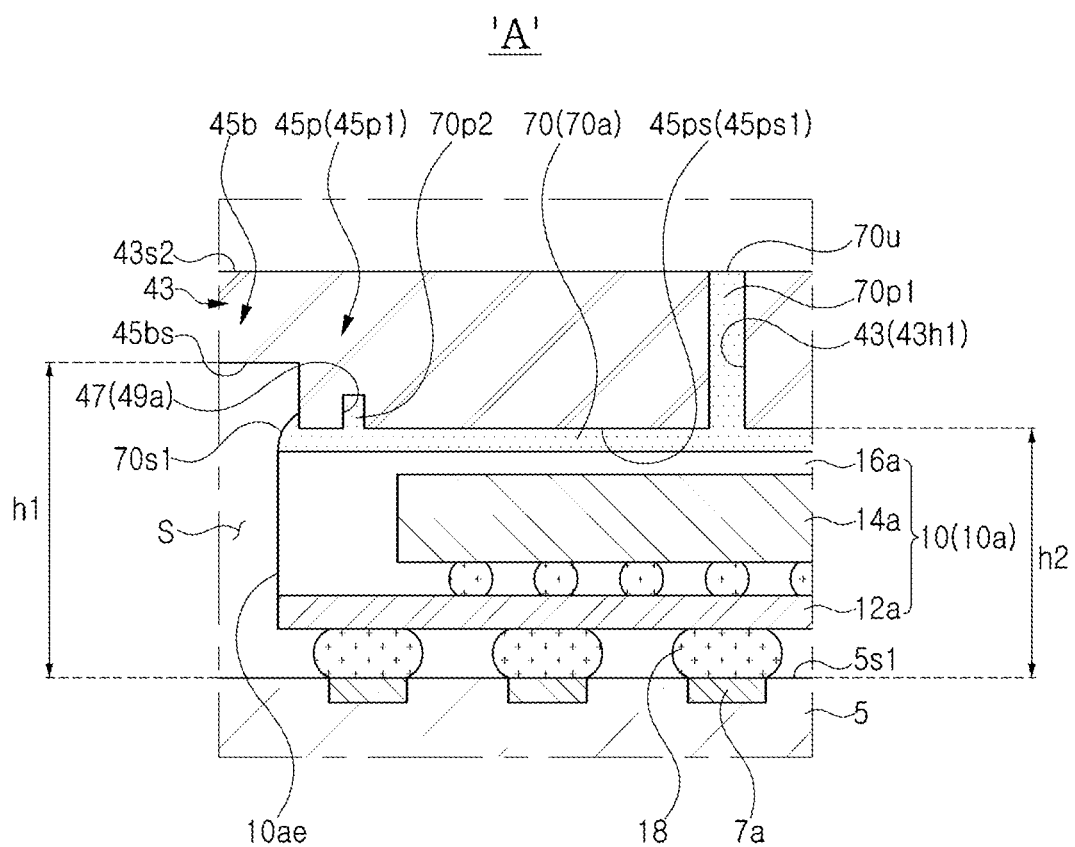
Figure 2B:
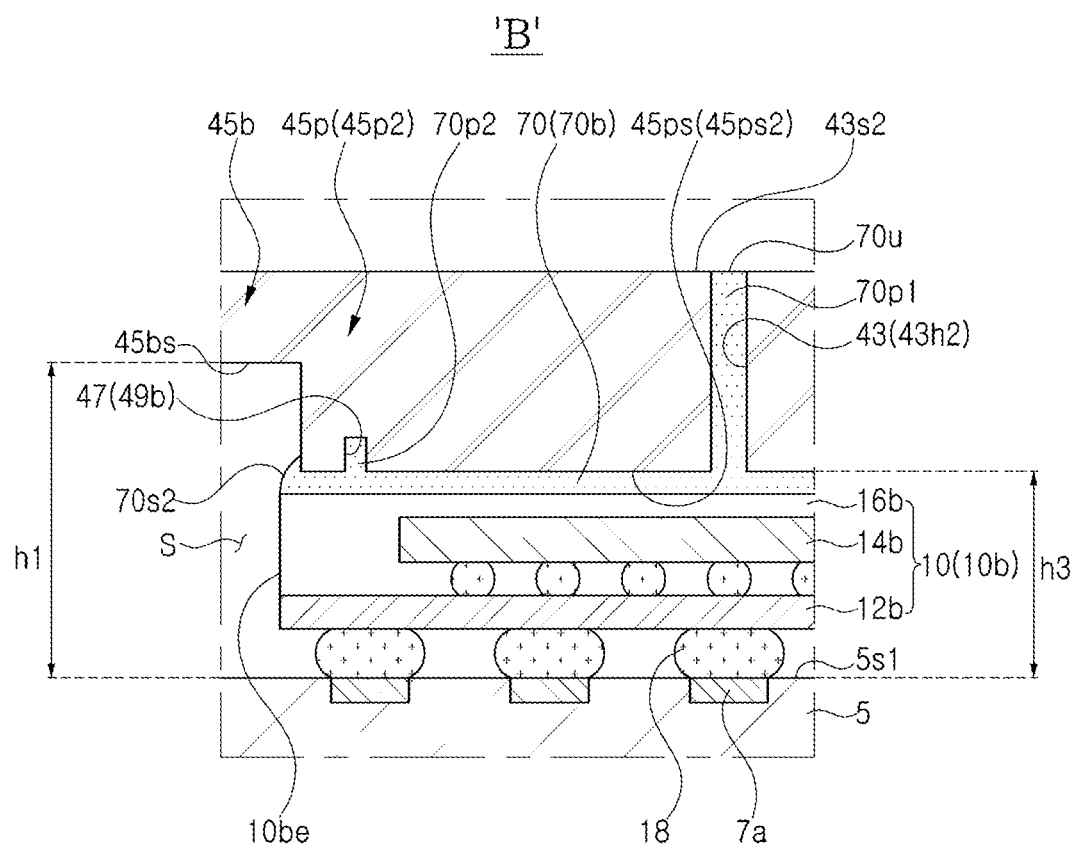
Figure 2C:
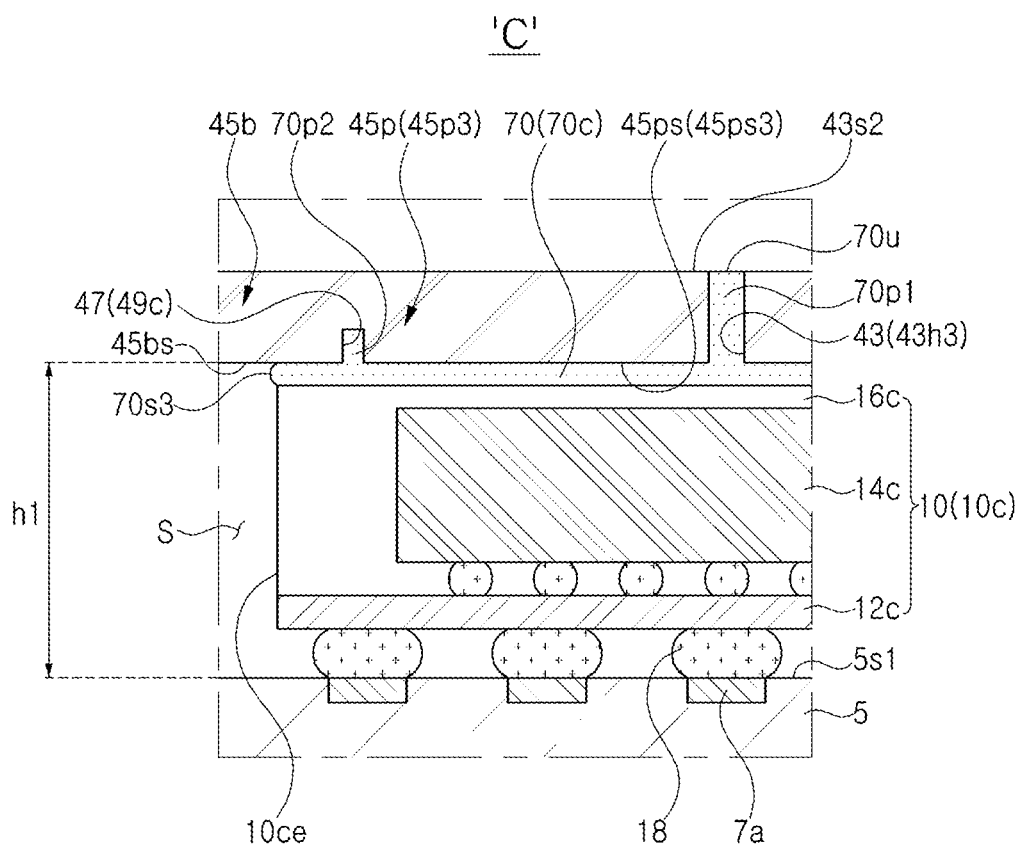

Example embodiment will be described hereinafter with reference to FIGS. 1, 2A, 2B, and 2C. FIG. 1 is a cross-sectional view of an electronic device according to an example embodiment, FIG. 2A is a partially enlarged view of an area indicated by 'A' in FIG. 1, FIG. 2B is a partially enlarged view of an area indicated by 'B' in FIG. 1, and FIG. 2C is a partially enlarged view of an area indicated by 'C' of FIG. 1.

Referring to FIGS. 1 and 2A to 2C, an electronic device 1 according to an example embodiment may include a substrate 5 having first and second surfaces $5s1$ and $5s2$ opposing each other, a case 40, a plurality of semiconductor packages 10, and a plurality of thermal interface material layers 70. The electronic device 1 may further include a passive element 80, e.g., a capacitor, mounted on the substrate 5.

The substrate 5 may be a printed circuit board (PCB) or a module substrate. The plurality of semiconductor packages 10 and the plurality of thermal interface material layers 70 may be mounted on the first and second surfaces $5s1$ and $5s2$ of the substrate 5.

The case 40 may include a first plate 43. The first plate 43 may have a first internal surface $43s1$ facing the first surface $5s1$ of the substrate 5, and a first external surface $43s2$ opposing the first internal surface $43s1$. The first plate 43 may include a plurality of front through-holes $43h$. In the first plate 43, the plurality of front through-holes $43h$ may penetrate from the first internal surface $43s1$ to the first external surface $43s2$. The plurality of front through-holes $43h$ may include at least one first through-hole $43h1$, at least one second through-hole $43h2$, and at least one third through-hole $43h3$.

The case 40 may further include a second plate 53. The first and second plates 43 and 53 may be formed of a material capable of dissipating heat, e.g., a metal material or a graphite material. In some embodiments, the first and second plates 43 and 53 may be referred to as first and second heat dissipation plates, respectively.

The second plate 53 may have a second internal surface $53s1$ facing the second surface $5s2$ of the substrate 5, and a second external surface $53s2$ opposing the second internal surface $53s1$ of the substrate 5. The second plate 53 may include a plurality of rear through-holes $53h$. It is noted that throughout the specification, "front" and "rear" are used to distinguish relative positions between components, and they may be interchangeable, e.g., or replaced with "first" and "second."

In the second plate 53, the plurality of rear through-holes $53h$ may penetrate from the second internal surface $53s1$ to the second external surface $53s2$. In the second plate 53, the plurality of rear through-holes $53h$ may include at least one fourth through-hole $53h1$, at least one fifth through-hole $53h2$, and at least one sixth through-hole $53h3$. The case 40 may further include a connection portion 60 connecting the first and second plates 43 and 53.

The first plate 43 may include a base region $45b$, a first package overlapping region ($10e$ in FIG. 3A) overlapping the first semiconductor package $10a$, a second package overlapping region overlapping the second semiconductor package $10b$, a package overlapping region ($10e'$ in FIG. 4) and a third package overlapping region $45p3$ overlapping the third semiconductor package $10c$.

The first plate 43 may include at least one protruding region $45p$ having a protruding surface $45ps$. For example, in the first plate 43, the first package overlapping region may include a first protruding region $45p1$ having a first protruding surface $45ps1$, and the second package overlapping region may include a second protruding region $45p2$ having a second protruding surface $45ps2$.

The base region $45b$ may have a base surface $45bs$ disposed at a first height level $h1$ from the first surface $5s1$ of the substrate 5. In the first protruding region $45p1$, the first protruding surface $45ps1$ may be disposed at a second height level $h2$ lower than the first height level $h1$, from the first surface $5s1$ of the substrate 5, e.g., the second height level $h2$ may be smaller than the first height level $h1$. In the second protruding region $45p2$, the second protruding surface $45ps2$ may be located at a third height level $h3$ lower than the second height level $h2$, from the first surface $5s1$ of the substrate 5, e.g., the third height level $h3$ may be smaller than the second height level $h2$. The third package overlapping region $45p3$ may have a package overlapping surface $45ps3$ disposed at the first height level $h1$ that is substantially the same as the base surface $45bs$.

In the first plate 43, the first internal surface $43s1$ may include the base surface $45bs$, the first and second protruding surfaces $45ps1$ and $45ps2$, and the package overlapping surface $45ps3$.

The second plate 53 may include a base region $55b$ having a base surface $55bs$, a fourth package overlapping region overlapping a fourth semiconductor package $20a$, a fifth package overlapping region overlapping a fifth semiconductor package $20b$, and a sixth package overlapping region $55p3$ overlapping a sixth semiconductor package $20c$ and having a package overlapping surface $55ps3$. In the second plate 53, the fourth package overlapping region may include a first protruding region 55p1 having a first protruding surface 55ps1, and the fifth package overlapping region may include a second protruding region 55p2 having a second protruding surface 55ps2. In the second plate 53, the second internal surface 53s1 may include the base surface 55bs, the first and second protruding surfaces 55ps1 and 55ps2, and the package overlapping surface 55ps3. Since the second internal surface 53s1 of the second plate 53 may be easily understood from the first internal surface 43s1 of the first plate 43, a detailed description of the second internal surface 53s1 of the second plate 53 will be omitted.

Figure 3A:
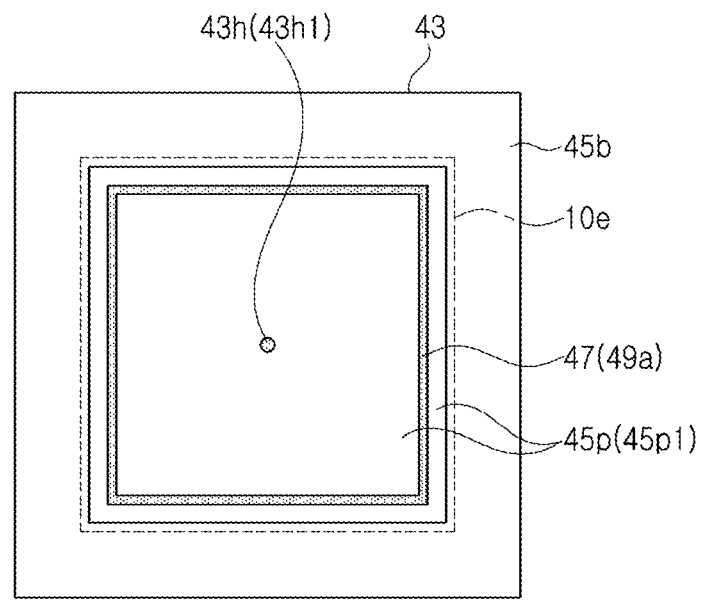
FIGS. 3A and 3B are diagrams of some components of an electronic device according to an example embodiment.
Figure 4:
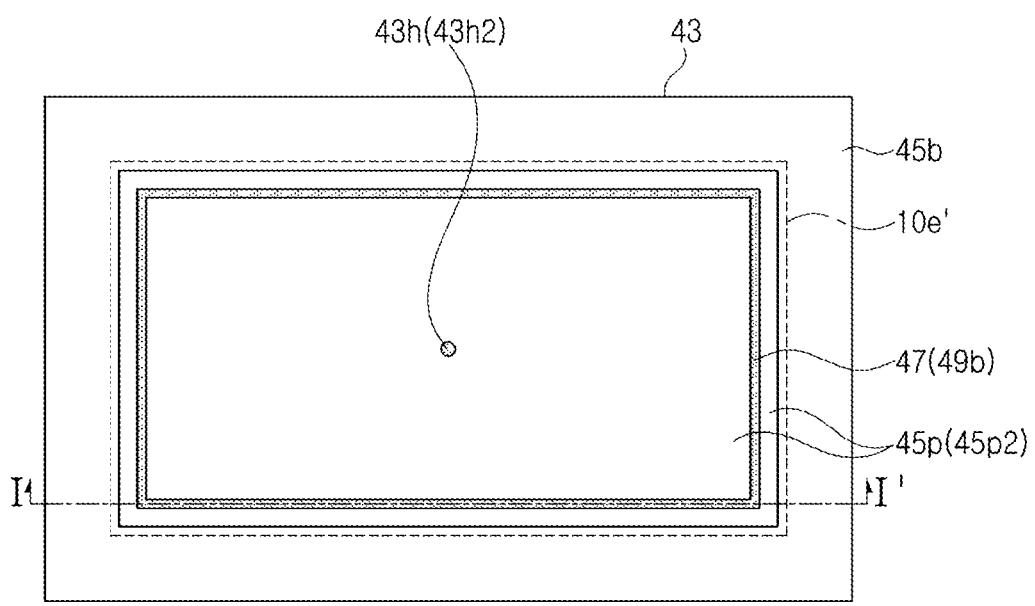
FIG. 4 is a diagram of another example of some components of an electronic device according to an example embodiment.

The first plate 43 may further include front engraved patterns 47. The second plate 53 may further include rear engraved patterns 57. For example, the front engraved patterns 47 of the first plate 43 may include first, second and third engraved patterns 49a, 49b and 49c, and the rear engraved patterns 57 of the second plate 53 may include fourth, fifth, and sixth engraved patterns 59a, 59b and 59c. In example embodiments, each of the engraved patterns 47 and 57 may have a closed loop, e.g., ring, shape, in a plan view, e.g., each of the engraved patterns 47 and 57 may have a quadrangular shape (FIGS. 3A and 4).

In the first plate 43, the first, second and third engraved patterns 49a, 49b and 49c may be engraved patterns formed in the first internal surface 43s1 of the first plate 43. For example, in the first plate 43, the first, second and third engraved patterns 49a, 49b and 49c may be formed by recessing from a portion of the first internal surface 43s1 of the first plate 43 in a vertical direction away from the first surface 5s1 of the substrate 5. In this case, the vertical direction may be a direction perpendicular to the first surface 5s1 of the substrate 5.

In the first plate 43, the first engraved pattern 49a may be disposed on the first protruding surface 45ps1 of the first internal surface 43s, e.g., the first engraved pattern 49a may extend along a perimeter of the first protruding surface 45ps1, the second engraved pattern 49b may be disposed on the second protruding surface 45ps2 of the first internal surface 43s, e.g., the second engraved pattern 49b may extend along a perimeter of the second protruding surface 45ps2, and the third engraved pattern 49c may be disposed on the package overlapping surface 45ps3 of the first internal surface 43s. A distance between the edge of the first protruding region 45p1 and the first engraved pattern 49a may be less than a distance between the center of the first protruding region 45p1 and the first engraved pattern 49a. A distance between the edge of the second protruding region 45p2 and the second engraved pattern 49b may be less than a distance between the center of the second protruding region 45p2 and the second engraved pattern 49b.

In the second plate 53, the fourth, fifth and sixth engraved patterns 59a, 59b and 59c may be engraved patterns formed in the second internal surface 53s1 of the second plate 53. For example, in the second plate 53, the fourth, fifth and sixth engraved patterns 59a, 59b and 59c may be formed by recessing from a portion of the second internal surface 53s1 of the second plate 53 in a vertical direction away from the second surface 5s2 of the substrate 5.

In the second plate 53, the fourth engraved pattern 59a may be disposed on the first protruding surface 55ps1 of the second internal surface 53s, and the fifth engraved pattern 59b may be disposed on the second protruding surface 55ps2 of the second internal surface 53s, and the sixth engraved pattern 59c may be disposed on the package overlapping surface 55ps3 of the second internal surface 53s.

The plurality of semiconductor packages 10 may be electrically connected to pads 7a and 7b of the substrate 5 by connection patterns 18. The plurality of semiconductor packages 10 may include front semiconductor packages 10a, 10b, and 10c mounted on the first surface 5s1 of the substrate 5. The plurality of semiconductor packages 10 may further include rear semiconductor packages 20a, 20b, and 20c mounted below the second surface 5s2 of the substrate 5.

The front semiconductor packages 10a, 10b, and 10c may be respectively mounted on the first surface 5s1 of the substrate 5, and may be disposed between the first surface 5s1 of the substrate 5 and the first internal surface 43s1 of the first plate 43. The rear semiconductor packages 20a, 20b, and 20c may be respectively mounted on the second surface 5s2 of the substrate 5, and may be disposed between the second surface 5s2 of the substrate 5 and the second internal surface 53s1 of the second plate 53.

The front semiconductor packages 10a, 10b, and 10c may include a first semiconductor package 10a, a second semiconductor package 10b, and a third semiconductor package 10c. The rear semiconductor packages 20a, 20b, and 20c may include a fourth semiconductor package 40a, a fifth semiconductor package 50b, and a sixth semiconductor package 20c.

In an example embodiment, at least two semiconductor packages among the plurality of semiconductor packages 10 may be different types of semiconductor packages. For example, one of the plurality of semiconductor packages 10 may be a controller semiconductor package, and the other may be a memory semiconductor package.

In an example embodiment, at least three semiconductor packages among the plurality of semiconductor packages 10 may include different types of semiconductor chips. For example, one of the plurality of semiconductor packages 10 may be a controller semiconductor package, another may be a first memory semiconductor package, and yet another may be a second memory semiconductor package. For example, one of the first to third semiconductor packages 10a, 10b, and 10c may be a controller semiconductor package, the other may be a first memory semiconductor package, and yet another may be a second memory semiconductor package. The first memory semiconductor package may be a non-volatile memory, e.g., a NAND flash memory, and the second memory semiconductor package may be a volatile memory, e.g., a dynamic random-access memory (DRAM). Any one of the plurality of semiconductor packages 10 may be a power semiconductor, e.g., Power Management Integrated Circuit (PMIC).

Each of the plurality of semiconductor packages 10 may include a package substrate, one or a plurality of semiconductor chips mounted on the package substrate, and an encapsulant sealing the one or plurality of semiconductor chips, on the package substrate. The encapsulant may include an insulating material, e.g., a resin such as an epoxy molding compound (EMC). For example, the first semiconductor package 10a may include a package substrate 12a, one or a plurality of semiconductor chips 14a mounted on the package substrate 12a, and an encapsulant 16a sealing the one or the plurality of semiconductor chips 14a, on the package substrate 12a. The second semiconductor package 10b may include a package substrate 12b, one or a plurality of semiconductor chips 14b mounted on the package substrate 12b, and an encapsulant 16b sealing the one or plurality of semiconductor chips 14b, on the package substrate 12b. The third semiconductor package 10c may include a package substrate 12c, one or a plurality of semiconductor chips 14c mounted on the package substrate 12c, and an encapsulant 16c sealing the one or plurality of semiconductor chips 14c, on the package substrate 12c. For example, a width of each of the semiconductor chips 14a to 14c may be smaller than a diameter of the closed loop of a corresponding one of engraved patterns 47.

In the first plate 43, a first package overlapping region including the first protruding region 45p1 having the first protruding surface 45ps1 may overlap the first semiconductor package 10a, a second package overlapping region including the second protruding region 45p2 having the second protruding surface 45ps2 may overlap the second semiconductor package 10b, and a third package overlapping region 45p3 having the package overlapping surface 45ps3 may overlap the third semiconductor package 10c.

In the second plate 53, a fourth package overlapping region including the first protruding region 55p1 having the first protruding surface 55ps1 may overlap the fourth semiconductor package 20a, a fifth package overlapping region including the second protruding region 55p2 having the second protruding surface 55ps2 may overlap the fifth semiconductor package 20b, and a sixth package overlapping region 55p3 having the package overlapping surface 55ps3 may overlap the sixth semiconductor package 20c.

The first semiconductor package 10a may overlap the first engraved pattern 49a and the at least one first through-hole 43h1, e.g., a width of the first semiconductor package 10a may be larger than a diameter of the closed loop of the first engraved pattern 49a. The second semiconductor package 10b may overlap the second engraved pattern 49b and the at least one second through-hole 43h2, e.g., a width of the second semiconductor package 10b may be larger than a diameter of the closed loop of the second engraved pattern 49b. The third semiconductor package 10c may overlap the third engraved pattern 49c and the at least one third through-hole 43h3, e.g., a width of the third semiconductor package 10c may be larger than a diameter of the closed loop of the third engraved pattern 49c. The fourth semiconductor package 20a may overlap the fourth engraved pattern 59a and the at least one fourth through-hole 53h1, e.g., a width of the fourth semiconductor package 20a may be larger than a diameter of the closed loop of the fourth engraved pattern 59a. The fifth semiconductor package 20b may overlap the fifth engraved pattern 59b and the at least one fifth through-hole 53h2, e.g., a width of the fifth semiconductor package 20b may be larger than a diameter of the closed loop of the fifth engraved pattern 59b. The sixth semiconductor package 20c may overlap the sixth engraved pattern 59c and the at least one sixth through-hole 53h3 e.g., a width of the sixth semiconductor package 20c may be larger than a diameter of the closed loop of the sixth engraved pattern 59c.

The plurality of thermal interface material layers 70 may be spaced apart from each other. The plurality of thermal interface material layers 70 may include front thermal interface material layers 70a, 70b and 70c disposed between the front semiconductor packages 10a, 10b and 10c and the first plate 43. The plurality of thermal interface material layers 70 may include rear thermal interface material layers 70d, 70e, and 70f disposed between the rear semiconductor packages 20a, 20b and 20c and the second plate 53.

A side surface of at least one of the front thermal interface material layers 70a, 70b, and 70c may be exposed by an empty space S between the first surface 5s1 of the substrate 5 and the first plate 43. For example, side surfaces of the front thermal interface material layers 70a, 70b, and 70c may be exposed by the empty space S. A side surface of at least one of the rear thermal interface material layers 70d, 70e, and 70f may be exposed to the empty space S between the second surface 5s2 of the substrate 5 and the second plate 53. For example, side surfaces of the rear thermal interface material layers 70d, 70e, and 70f may be exposed to the empty space S. The empty space S may be a space filled with air. Accordingly, the side surfaces of the thermal interface material layers 70 may be exposed to air.

The front thermal interface material layers 70a, 70b, and 70c may include a first thermal interface material layer 70a, a second thermal interface material layer 70b, and a third thermal interface material layer 70c.

The first thermal interface material layer 70a may be disposed between the first semiconductor package 10a and the first plate 43, and may be in contact with the upper surface of the first semiconductor package 10a and the first internal surface 43s1 of the first plate 43. At least a portion of the first thermal interface material layer 70a may contact the first protruding surface 45ps1 and an upper surface of the first semiconductor package 10a. The first thermal interface material layer 70a may further include a first portion 70p1, e.g., completely, filling at least a portion of the at least one first through-hole 43h1, and a second portion 70p2, e.g., completely, filling at least a portion of the first engraved pattern 49a. The first thermal interface material layer 70a may cover at least a portion of a side surface of the first protruding region 45p1. At least a portion of a side surface 70s1 of the first thermal interface material layer 70a may have a curved shape. At least a portion of the first thermal interface material layer 70a may contact at least a portion of an edge of the upper surface of the first semiconductor package 10a. A side surface 10ae of the first semiconductor package 10a may be exposed by an empty space S between the first surface 5s1 of the substrate 5 and the first plate 43.

The second thermal interface material layer 70b may be disposed between the second semiconductor package 10b and the first plate 43, and may be in contact with the upper surface of the second semiconductor package 10b and the first internal surface 43s1 of the first plate 43. At least a portion of the second thermal interface material layer 70b may contact the second protruding surface 45ps2 and an upper surface of the second semiconductor package 10b. The second thermal interface material layer 70b may further include a first portion 70p1 filling at least a portion of the at least one second through-hole 43h2, and a second portion 70p2 filling at least a portion of the second engraved pattern 49b. When viewed with respect to the first surface 5s1 of the substrate 5, the lower surface of the second thermal interface material layer 70b may be disposed at a height level different from the lower surface of the first thermal interface material layer 70a. For example, the lower surface of the second thermal interface material layer 70b may be disposed at a lower height level than the lower surface of the first thermal interface material layer 70a, e.g., relative to the first surface 5s1 of the substrate 5. The second thermal interface material layer 70b may cover at least a portion of a side surface of the second protruding region 45p2. At least a portion of a side surface 70s2 of the second thermal interface material layer 70b may have a curved shape. At least a portion of the second thermal interface material layer 70b may contact at least a portion of an edge of the upper surface of the second semiconductor package 10b. A side surface 10be of the second semiconductor package 10b may be exposed by the empty space S between the first surface 5s1 of the substrate 5 and the first plate 43.

The third thermal interface material layer 70c may be disposed between the third semiconductor package 10c and the first plate 43, and may be in contact with the upper surface of the third semiconductor package 10c and the first internal surface 43s1 of the first plate 43. The third thermal interface material layer 70c may further include a first portion 70p1 filling at least a portion of the at least one third through-hole 43h3, and a second portion 70p2 filling at least a portion of the third engraved pattern 49c. When viewed with respect to the first surface 5s1 of the substrate 5, the lower surface of the third thermal interface material layer 70c may be disposed at a height level different from the lower surfaces of the first and second thermal interface material layers 70a and 70b. For example, a lower surface of the third thermal interface material layer 70c may be disposed at a higher level than lower surfaces of the first and second thermal interface material layers 70a and 70b, e.g., relative to the first surface 5s1 of the substrate 5.

The rear thermal interface material layers 70d, 70e, and 70f may include a fourth thermal interface material layer 70d, a fifth thermal interface material layer 70e, and a sixth thermal interface material layer 70f. The fourth thermal interface material layer 70d may be disposed between the fourth semiconductor package 20a and the second plate 53, and may be in contact with the upper surface of the fourth semiconductor package 20a and the second internal surface 53s1 of the second plate 53. The fourth thermal interface material layer 70d may further include a portion filling at least a portion of the at least one fourth through-hole 53h1, and a portion filling at least a portion of the fourth engraved pattern 59a. The fourth thermal interface material layer 70d may have a mirror-symmetric structure with the first thermal interface material layer 70a.

The fifth thermal interface material layer 70e may be disposed between the fifth semiconductor package 20b and the second plate 53, and may be in contact with the upper surface of the fifth semiconductor package 20b and the second internal surface 53s1 of the second plate 53. The fifth thermal interface material layer 70e may further include a portion filling at least a portion of the at least one fifth through-hole 53h2 and a portion filling at least a portion of the fifth engraved pattern 59b. The fifth thermal interface material layer 70e may have a mirror-symmetric structure with the second thermal interface material layer 70b.

The sixth thermal interface material layer 70f is disposed between the sixth semiconductor package 20c and the second plate 53, and may be in contact with the upper surface of the sixth semiconductor package 20c and the second internal surface 53s1 of the second plate 53. The sixth thermal interface material layer 70f may further include a portion filling at least a portion of the at least one sixth through-hole 53h3 and a portion filling at least a portion of the sixth engraved pattern 59c. The sixth thermal interface material layer 70e may have a mirror-symmetric structure with the third thermal interface material layer 7c.

In the above-described embodiment, semiconductor packages having different types among the semiconductor packages 10 may have different shapes and/or different sizes. For example, when viewed from above, the semiconductor packages 10 may be divided into a semiconductor package having a square shape or a shape close to a square, and a semiconductor package having a shape of a rectangle or a shape close to a rectangle. Among the semiconductor packages 10, one or a plurality of semiconductor packages may have a square shape or a shape close to a square, and one or a plurality of semiconductor packages may have a rectangle shape or a shape close to a rectangle. For example, the first semiconductor package 10a may have a square shape or a shape close to a square, and the second semiconductor package 10b may have a rectangle shape or a shape close to a rectangle.

According to example embodiments, the formation of the thermal interface material layers 70 may include covering the substrate 5, on which the semiconductor packages 10 are mounted, with the case 40, and then, injecting a liquid thermal interface material (TIM) into the front through-holes 43h of the first plate 43, and curing the injected liquid thermal interface material (TIM), injecting a liquid thermal interface material (TIM) into the rear through-holes 53h of the second plate 53, and curing the injected liquid thermal interface material (TIM).

The engraved patterns 47 and 57 of the first and second plates 43 and 53 may prevent the injected liquid thermal interface materials TIM from flowing to side surfaces of the semiconductor packages 10. Accordingly, the thermal interface material layers 70 may be stably formed without defects. In addition, due to the engraved patterns 47 and 57 of the plates 43 and 53, the contact area between the upper surfaces of the semiconductor packages 10 and the thermal interface material layers 70 may be increased. Therefore, the heat dissipation characteristics of the electronic device 1 may be improved.

Hereinafter, an illustrative example of the first package overlapping region 10e of the first plate 43 facing the first semiconductor package 10a will be described with reference to FIGS. 3A and 3B, and an illustrative example of the second package overlapping region 10e' of the first plate 43, facing the second semiconductor package 10b, will be described with reference to FIG. 4. FIG. 3A is a top view of the first package overlapping region 10e of the first plate 43, and FIG. 3B is a schematic perspective view illustrating the first package overlapping region 10e of the first plate 43, as viewed from below.

Figure 3B:
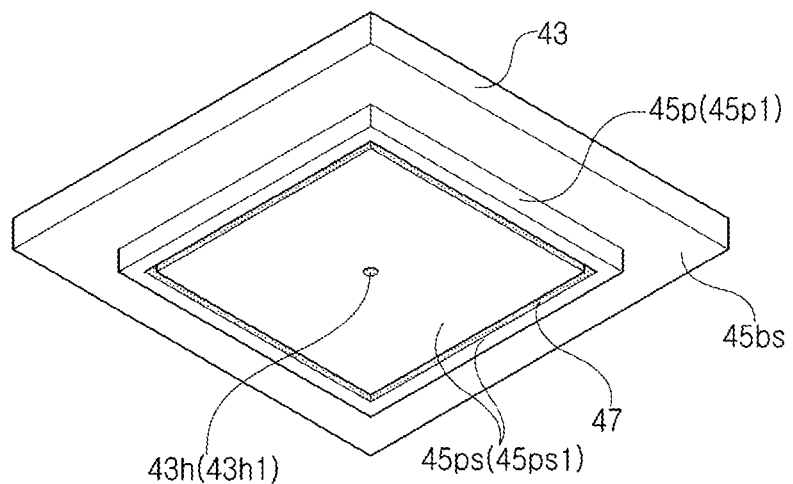

Referring to FIGS. 3A, 3B and 4, in the first plate 43, the first package overlapping region 10e and the second package overlapping region 10e' may be surrounded by the base region 45b having the base surface 45bs. The first protruding region 45p1 having the first protruding surface 45ps1 and the second protruding region 45p2 having the first protruding surface (45ps2 in FIG. 2B) may have a shape protruding from the base region 45b.

Each of the first and second engraved patterns 49a and 49b may have a quadrangular ring shape. The first through-hole 43h1 may be, e.g., completely, surrounded by the first engraved pattern 49a, e.g., in a plan view. The second through-hole 43h2 may be, e.g., completely, surrounded by the second engraved pattern 49b, e.g., in a plan view.

A distance between the first engraved pattern 49a and an edge of the first protruding region 45p1 may be less than a distance between the first engraved pattern 49a and a center of the first protruding region 45p1. A distance between the second engraved pattern 49b and an edge of the second protruding region 45p2 may be less than a distance between the second engraved pattern 49b and a center of the second protruding region 45p2.

When viewed from above, an edge of the first protruding region 45p1 may be surrounded by an edge of the first semiconductor package 10a (see FIG. 1). The edge of the first semiconductor package (10a of FIG. 1) may be the same as the edge of the first package overlapping region 10e that is indicated by reference numeral 10e in FIG. 3A. An edge of the second protruding region 45p2 may be surrounded by an edge of the second semiconductor package (10b of FIG. 1). The edge of the second semiconductor package (10b of FIG. 1) may be the same as an edge of the second package overlapping region 10e' that is indicated by reference numeral 10e' in FIG. 4.

As illustrated in FIGS. 1 to 2C, in an example, in each of the thermal interface material layers 70, the first portion 70p1 may respectively fill the through-holes 43h and 53h, and may have a flat upper surface 70u. However, the embodiments are not limited thereto. Hereinafter, a modified example of the first portion 70p1 in each of the thermal interface material layers 70 will be described with reference to FIGS. 5A and 5B. Each of FIGS. 5A and 5B is a diagram schematically illustrating a modified example of the first thermal interface material layer 70a of FIG. 2A.

Figure 5A:
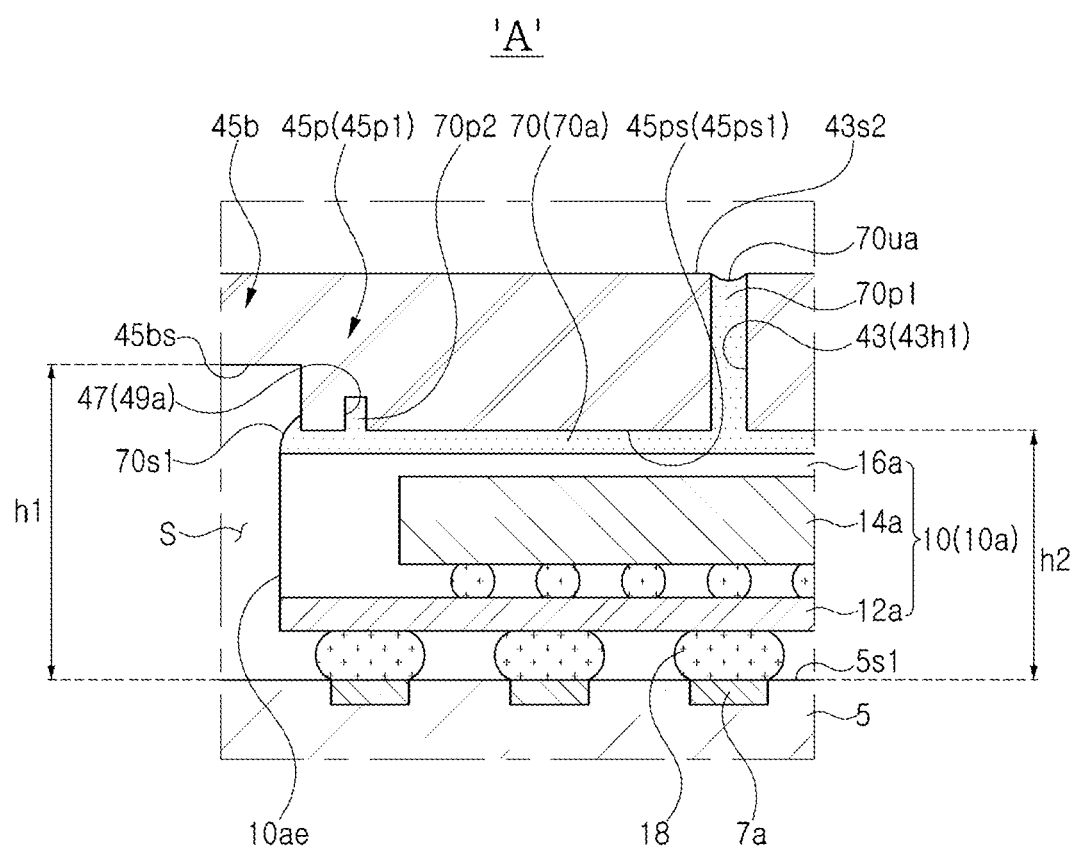
FIG. 5A is a diagram of another example of some components of an electronic device according to an example embodiment.

In a modified example, referring to FIG. 5A, the first portion 70p1 of the first thermal interface material layer 70a may be modified to have an upper surface 70ua that extends from the first external surface 43s2 and has a concave shape. The upper surface 70ua of the first thermal interface material layer 70a may have a concave curved shape.

Figure 5B:
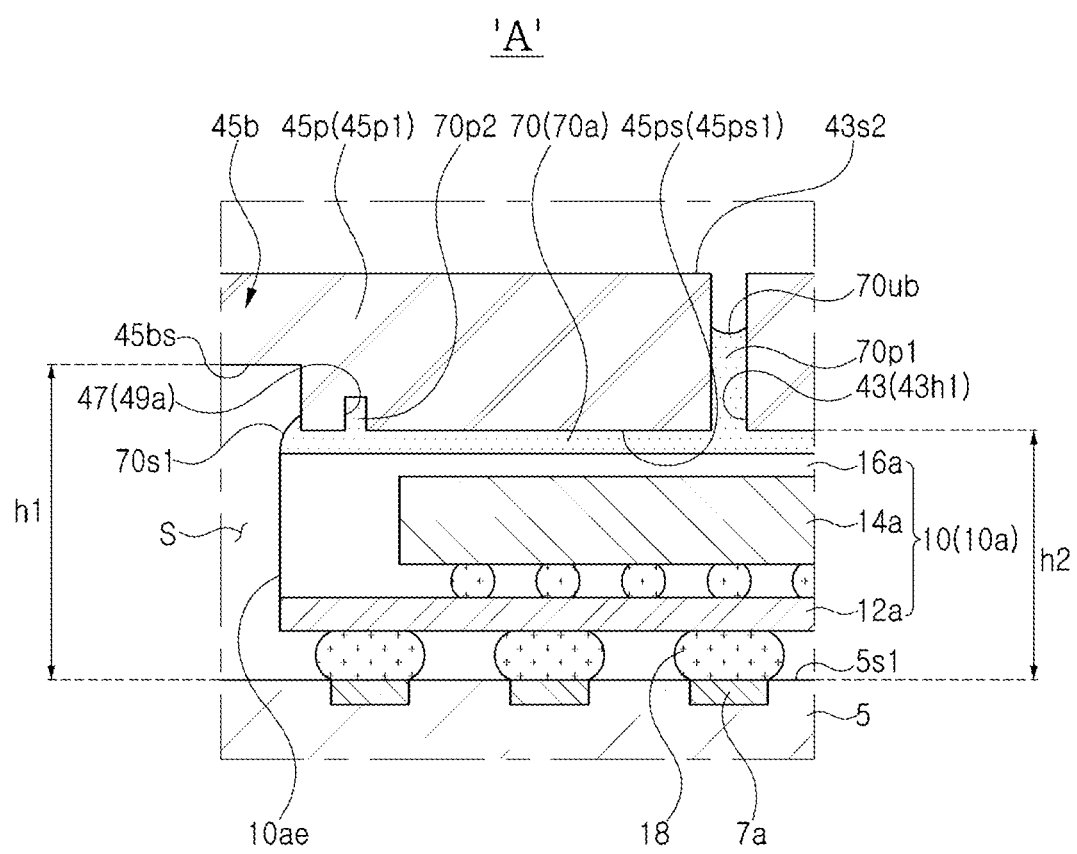
FIG. 5B is a diagram of another example of some components of an electronic device according to an example embodiment.

In a modified example, referring to FIG. 5B, the first portion 70p1 of the first thermal interface material layer 70a may be modified to have an upper surface 70ub that is disposed on a level lower than the first external surface 43s2 and has a concave shape. The upper surface 70ub of the first thermal interface material layer 70a may have a concave curved shape. The first portion 70p1 of the first thermal interface material layer 70a may partially fill the first through-hole 43h1.

Figure 6:
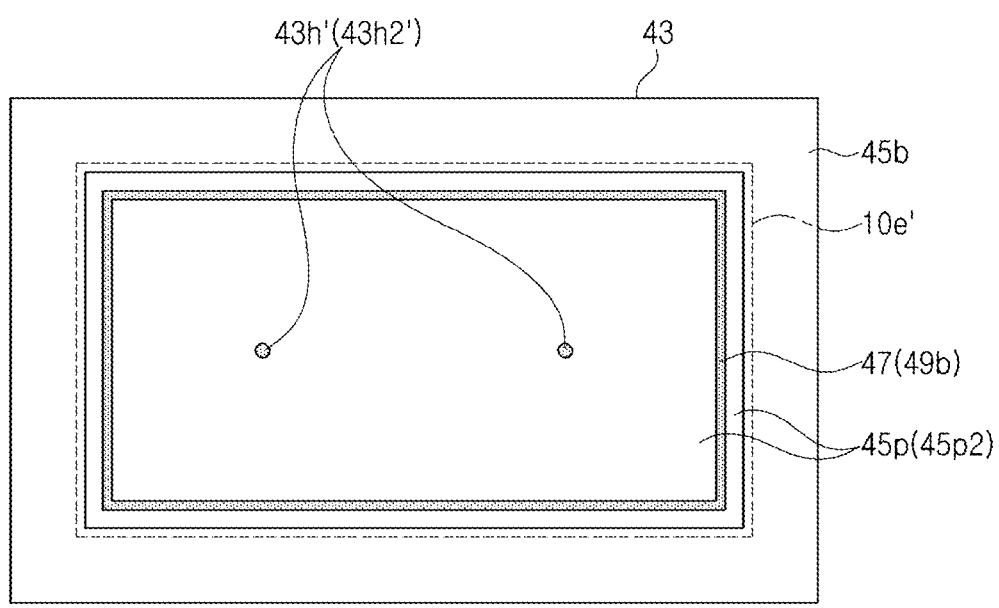
FIG. 6 is a diagram of another example of some components of an electronic device according to an example embodiment.
Figure 7A:
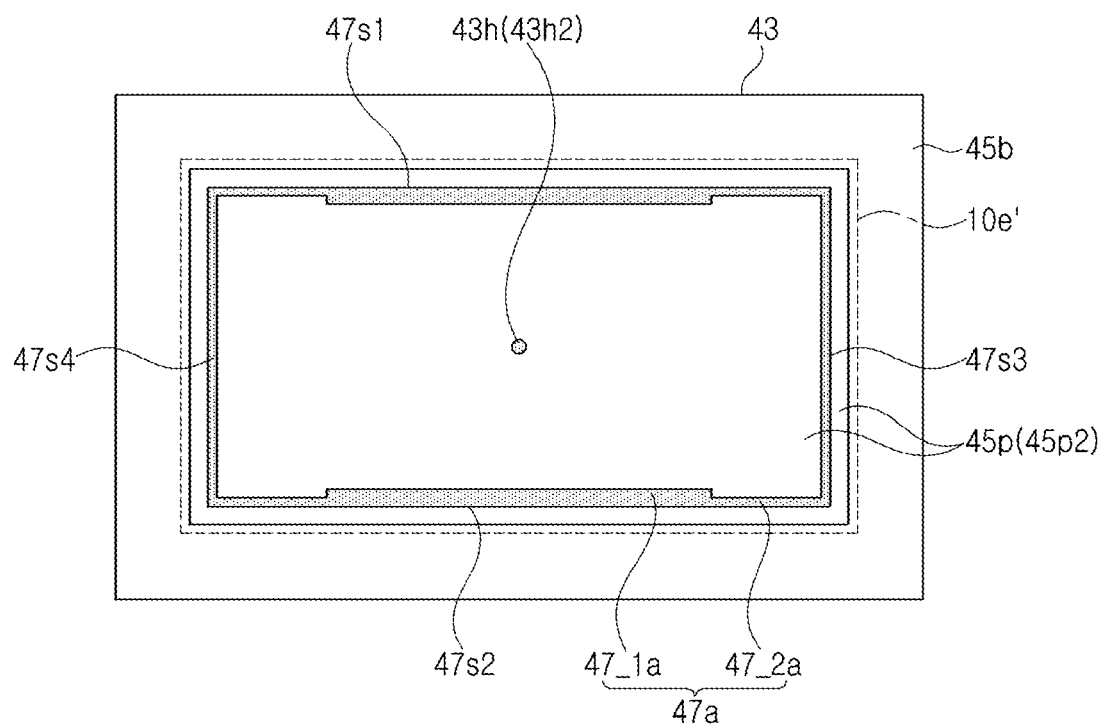
FIG. 7A is a diagram of another example of some components of an electronic device according to an example embodiment.
Figure 7B:
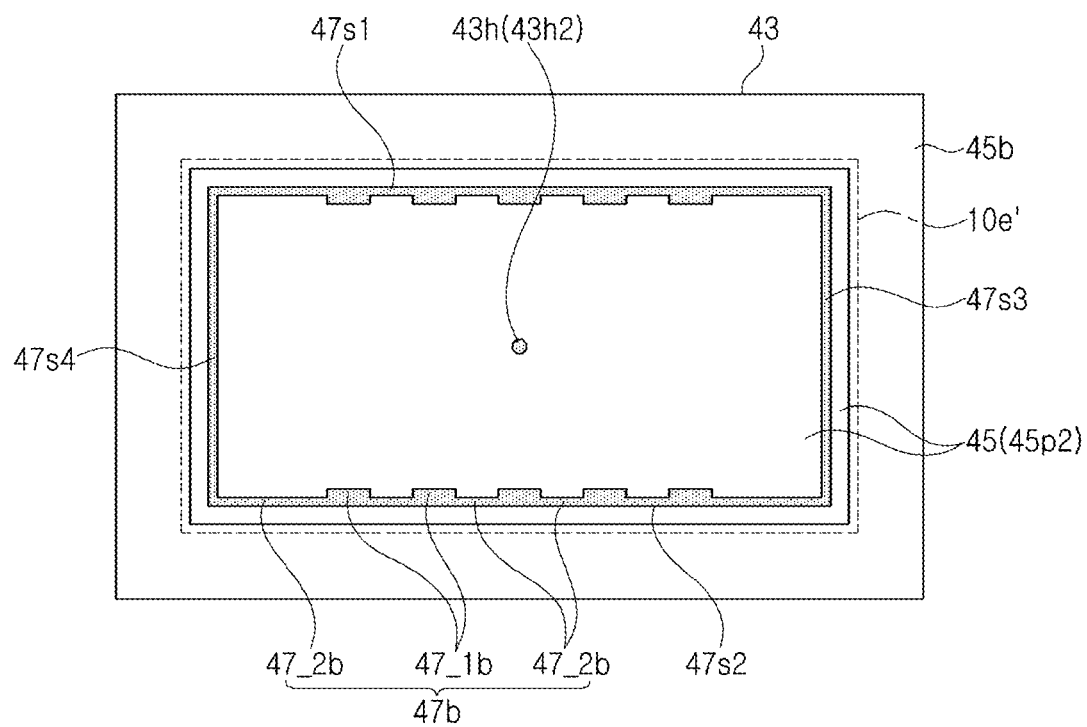
FIG. 7B is a diagram of another example of some components of an electronic device according to an example embodiment.

Next, various modified examples of the through-holes 43h will be described with reference to FIGS. 6, 7A, and 7B, respectively. FIGS. 6, 7A, and 7B are top views illustrating modified examples of the through-holes 43h in the electronic device according to an example embodiment.

In a modified example, referring to FIG. 6, there may be a plurality of through-holes 43h' overlapping one semiconductor package, e.g., as compared to FIGS. 1 to 5B illustrating a single through-hole 43h overlapping one semiconductor package. For example, as illustrated in FIG. 6, the through-hole 43h' surrounded by the engraved pattern 47 having the shape of a single ring may be plural. For example, the second through-hole 43h2 in FIG. 4 may be replaced with a plurality of second through-holes 43h2'. Accordingly, the number of the first through-hole 43h1 described in FIG. 1 may be singular or plural, the number of the second through-hole 43h2 may be singular or plural, the number of the third through-hole 43h3 may be singular or plural, the number of the fourth through-hole 53h1 may be singular or plural, the number of the fifth through-hole 53h2 may be singular or plural, and the number of the sixth through-hole 53h3 may be singular or plural.

In a modified example, referring to FIG. 7A, one ring-shaped engraved pattern 47a may include a first portion 47_1a having a first width, and a second portion 47_2a having a second width less than the first width, e.g., as compared to FIGS. 3A to 4 illustrating one ring-shaped engraved pattern 47 having a uniform thickness. When viewed from above, as illustrated in FIG. 7A, the engraved pattern 47a may have a first side 47s1 and a second side 47s2 opposing each other, and a third side 47s3 and a fourth side 47s4 opposing each other. Each of the first and second sides 47s1 and 47s2 may be greater, e.g., longer in a longitudinal direction, than each of the third and fourth sides 47s3 and 47s4. In the engraved pattern 47a, the first portion 47_1a having a relatively great width, e.g., in a direction normal to the longitudinal direction, may be disposed in a center portion of each of the first and second sides 47s1 and 47s2.

In a modified example, referring to FIG. 7B, when viewed from above, the first portion 47_1a having the first width described with reference to FIG. 7A may be modified such that the portion 47_1b having the first width and the portion 47_2b having the second width are repeatedly arranged. Accordingly, in any one engraved pattern 47b, the respective middle portions of the first and second sides 47s1 and 47s2 described in FIG. 7A may be replaced with the portions 47_1b and 47_2b repeatedly arranged and having different widths.

Figure 8:
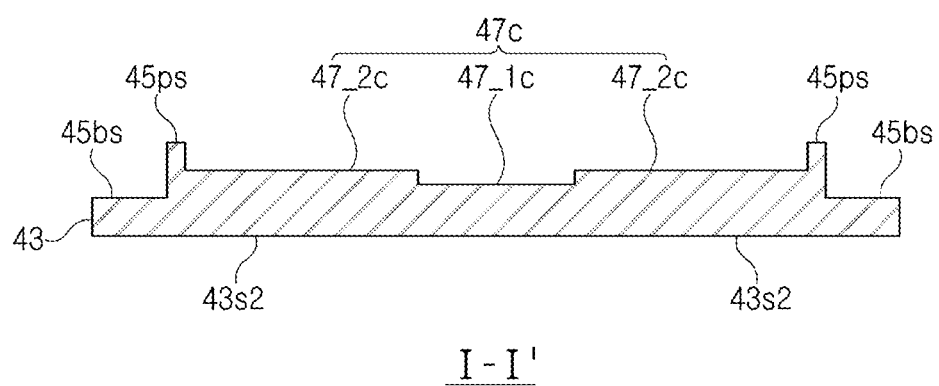
FIG. 8 is a diagram of another example of some components of an electronic device according to an example embodiment.

Next, another modified example of the through-holes 43h will be described with reference to FIG. 8, respectively. FIG. 8 is a cross-sectional view of the first plate 43, taken along line I-I' of FIG. 4, to describe another modified example of the through-holes 43h in the electronic device according to an example embodiment.

In a modified example, referring to FIG. 8, each of the engraved patterns (47 of FIG. 1) described above may have a shape recessed to a uniform depth. However, the embodiment is not limited thereto. For example, at least one of the engraved patterns 47 in FIG. 1 described above may include regions recessed to different depths. For example, as illustrated in FIG. 8, any one engraved pattern 47c may include a first region 47_1c recessed to a first depth from the protruding surface 45ps of the first plate 43, and a second region 47_2c recessed to a second depth, shallower than the first depth.

Figure 9:
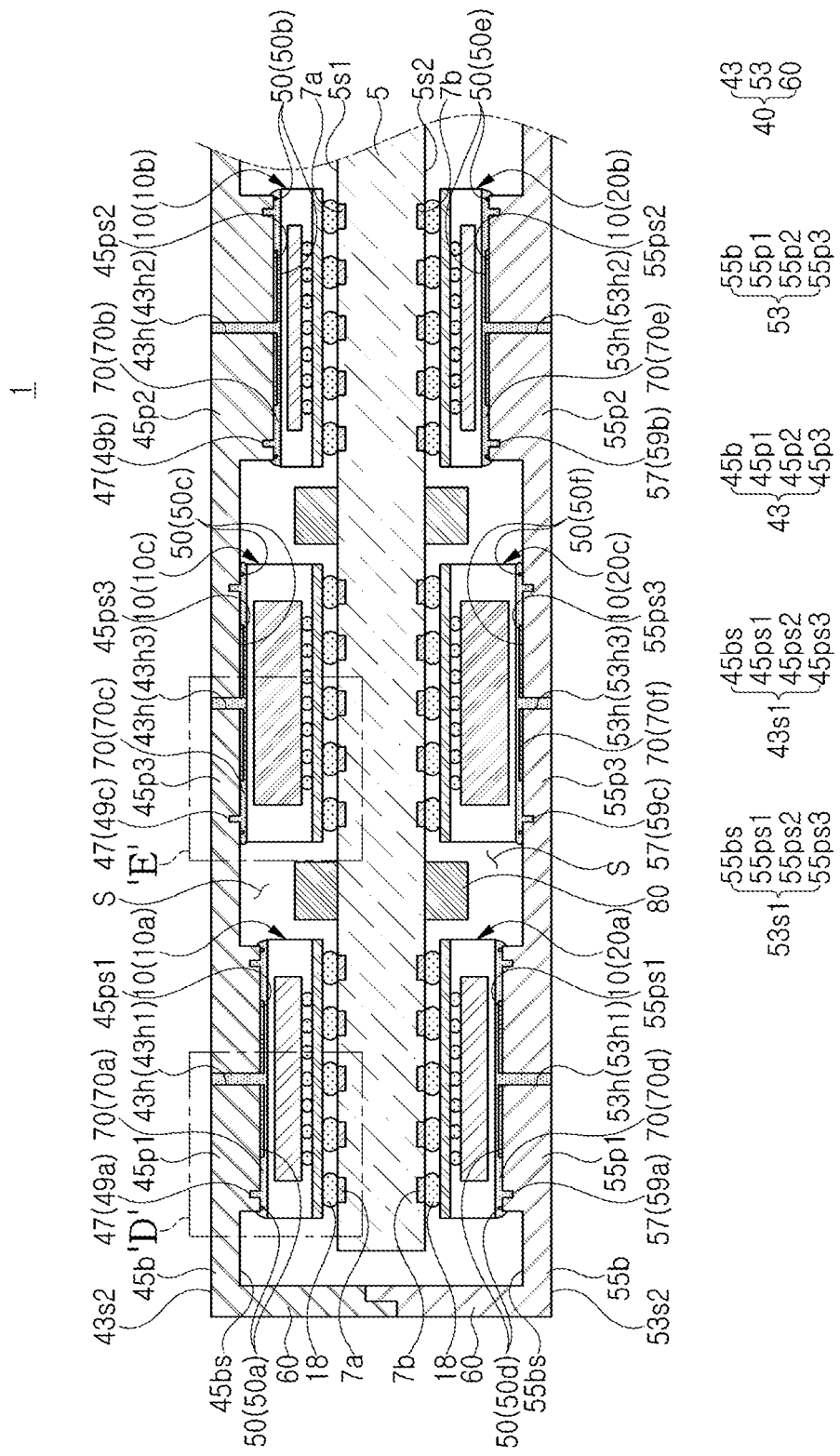
FIGS. 9, 10A, and 10B are schematic views of an electronic device according to a modified embodiment.

Next, an electronic device according to a modified embodiment will be described with reference to FIGS. 9, 10A and 10B. FIG. 9 is a cross-sectional view schematically illustrating an electronic device according to a modified embodiment, FIG. 10A is a partially enlarged view of an area indicated by 'A1' in FIG. 9, and FIG. 10B is a partially enlarged view of an area indicated by 'A2' in FIG. 9.

Figure 10A:
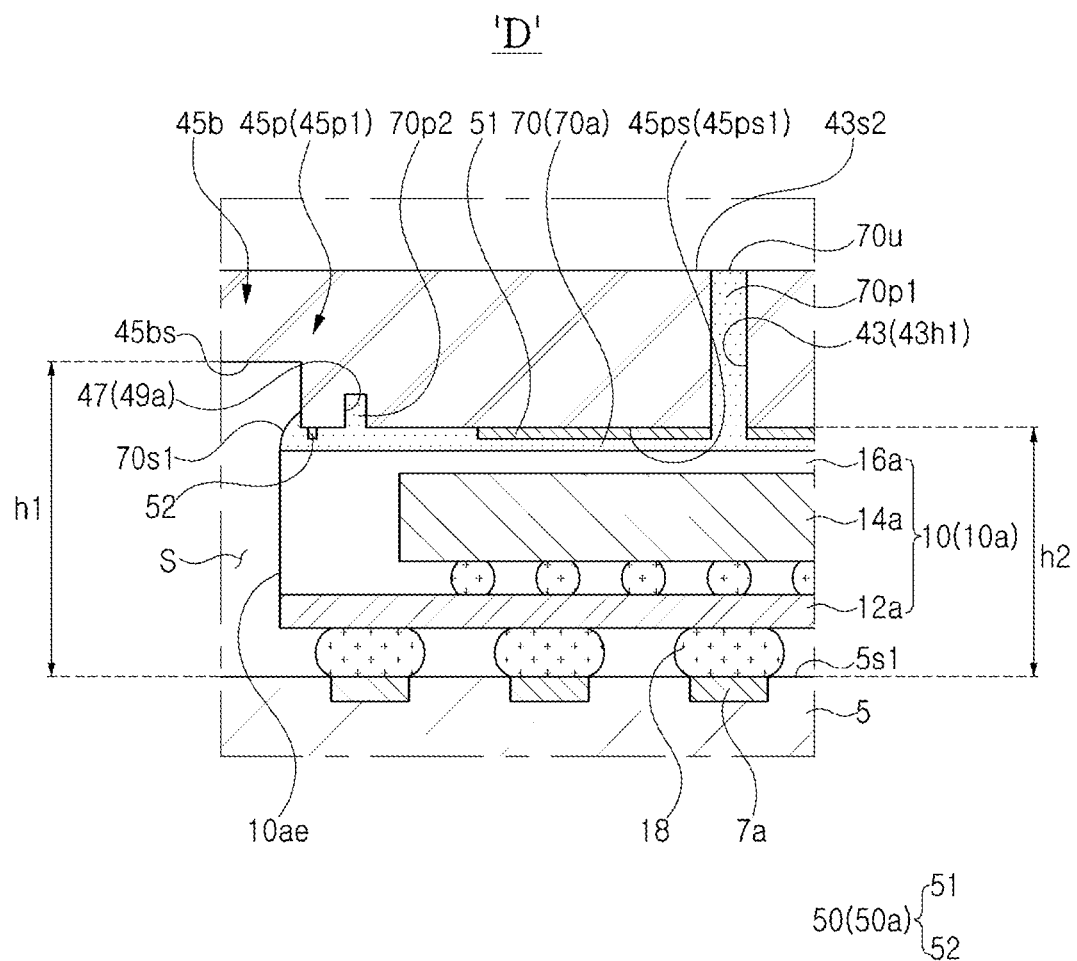
Figure 10B:
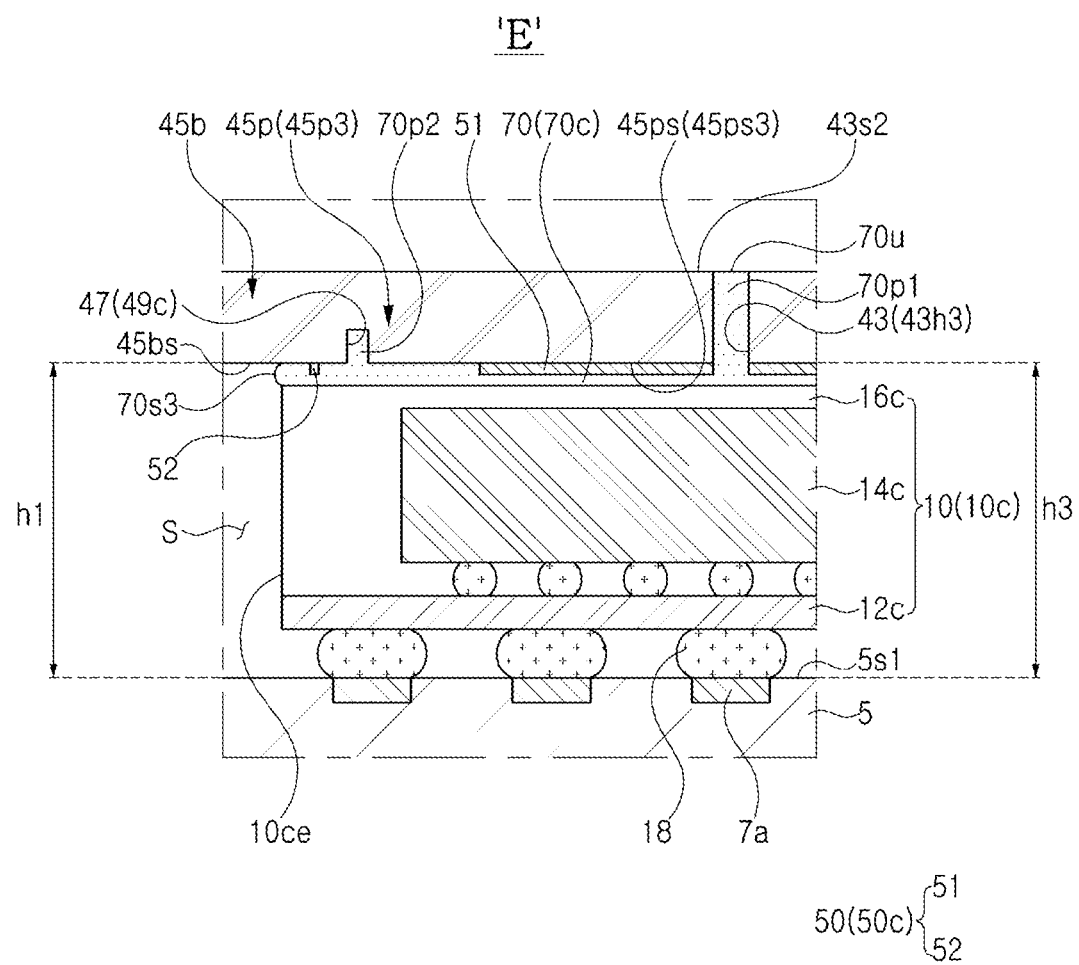

Referring to FIGS. 9, 10A, and 10B, the first and second plates 43 and 53 described above may further include embossed patterns 50. For example, the first plate 43 may include a first embossed pattern 50a disposed below the first protruding surface 45ps1 of the first package overlapping region (10e in FIG. 3A) overlapping the first semiconductor package 10a described above, a second embossed pattern 50b disposed below the second protruding surface 45ps2 of the second package overlapping region (10e' in FIG. 4) overlapping the second semiconductor package 10b, and a third embossed pattern 50c disposed below the package overlapping surface 45ps3 of the third package overlapping region 45p3, overlapping the third semiconductor package 10c. The second plate 53 may include a fourth embossed pattern 50d disposed on the first protruding surface 55ps1 of a fourth package overlapping region overlapping the fourth semiconductor package 20a, a fifth embossed pattern 50e disposed on the second protruding surface 55ps2 of a fifth package overlapping region overlapping the fifth semiconductor package 20b, and a sixth embossed pattern 50f disposed on the package overlapping surface 55ps3 of the sixth package overlapping region 55p3 overlapping the sixth semiconductor package 20c.

In an example, the first plate 43 may be integrally formed. For example, the first embossed pattern 50a may have a shape continuously extending without a boundary surface from the first protruding surface 45ps1.

In another example, the embossed patterns 50 may be formed in an attached form. For example, the first embossed pattern 50a may be attached to the first protruding surface 45ps1 to form an interface with the first protruding surface 45ps1. The embossed patterns 50 may include a metal material or a graphite material.

Each of the embossed patterns 50 may include at least one of a first embossed portion 51 surrounded by one engraved pattern 47 of a ring shape and a second embossed portion 52 surrounding the one engraved pattern 47. The second embossed portion 52 may have a ring shape, and may surround the engraved pattern 47. For example, the first embossed pattern 50a may include the first embossed portion 51 surrounded by the first engraved pattern 49a, and the second embossed portion 52 surrounding the first embossed pattern 49a.

In some embodiments, the first and second plates 43 and 53 may include at least one of the engraved patterns 47 and 57 and the embossed patterns 50. For example, the engraved patterns 47 may be omitted, and the first and second plates 43 and 53 may include the embossed patterns 50.

In some embodiments, at least one of the engraved patterns 47 and 57 and the embossed patterns 50 may prevent injected liquid thermal interface materials (TIM) from flowing to the side surfaces of the semiconductor packages 10 during injecting the liquid thermal interface material (TIM) into the through-holes 43h and 53h of the first and second plates 43 and 53 and curing the injected liquid thermal interface material (TIM), and thus, the thermal interface material layers 70 may be stably formed without defects.

Figure 11A:
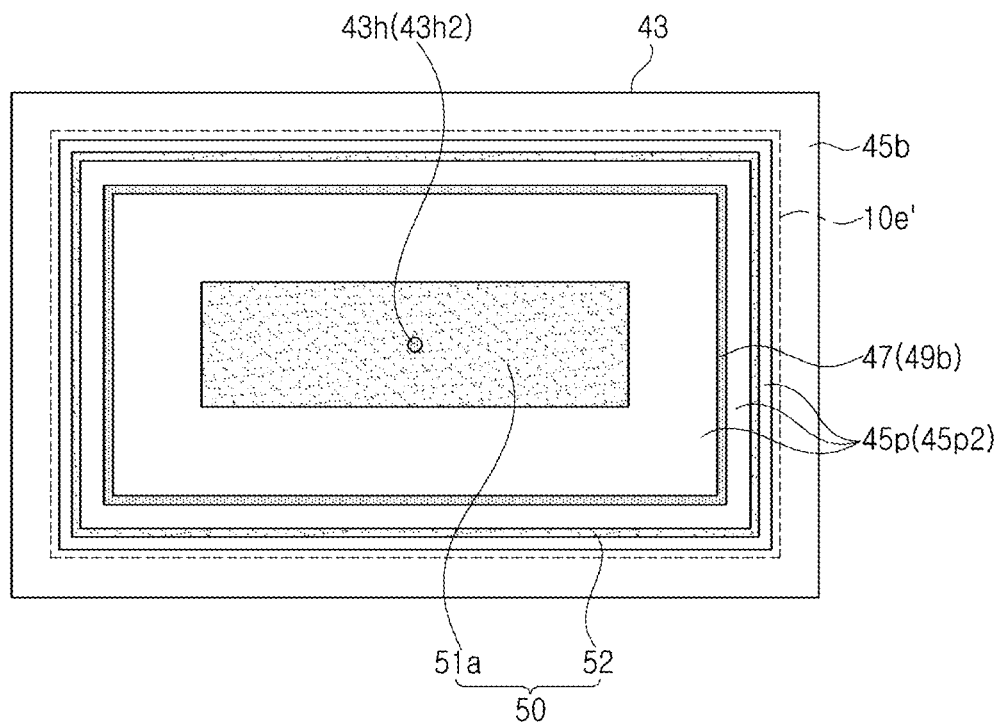
FIG. 11A is a diagram of an example of some components of an electronic device according to a modified embodiment.
Figure 11B:
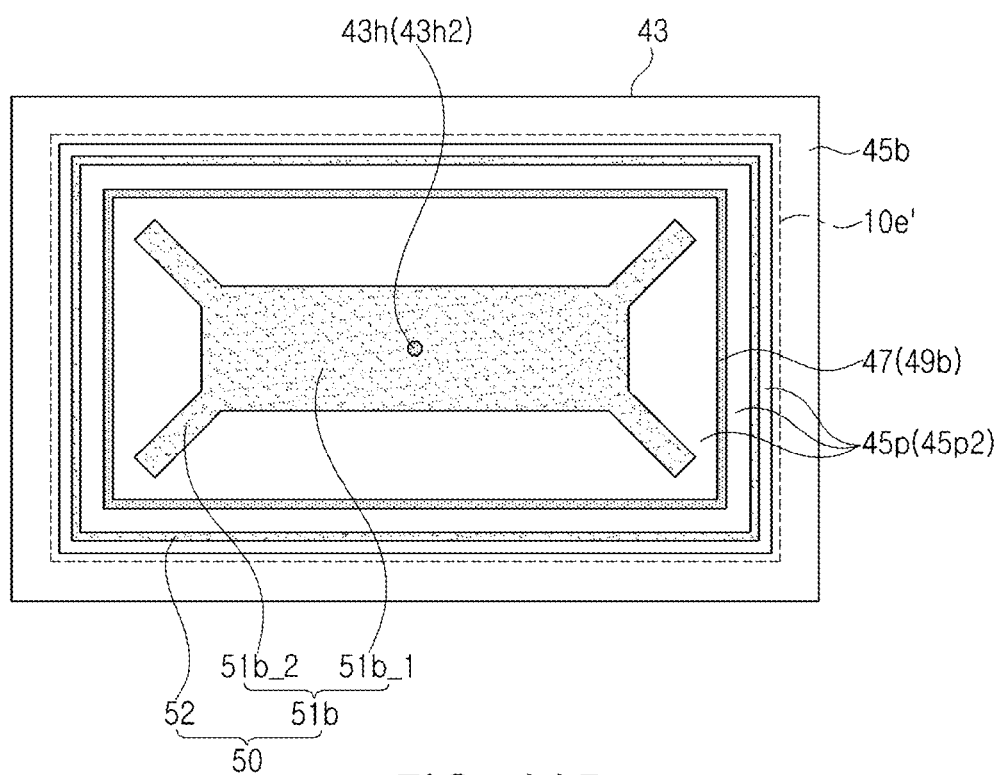
FIG. 11B is a diagram of another example of some components of an electronic device according to a modified embodiment.
Figure 11C:
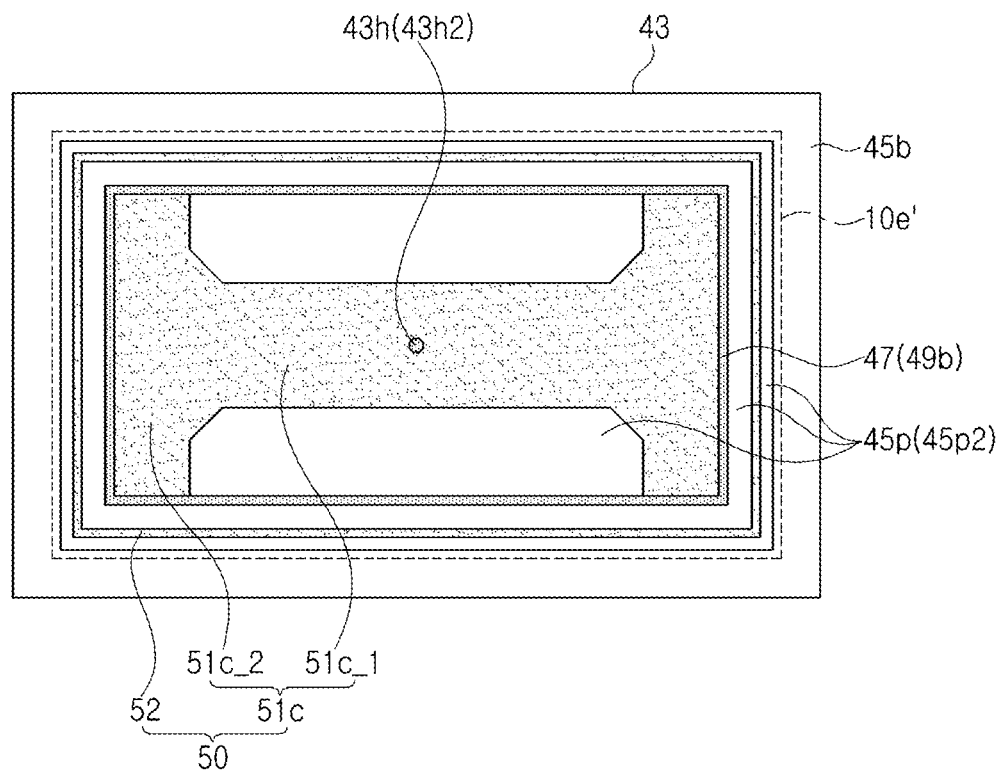
FIG. 11C is a diagram of another example of some components of an electronic device according to a modified embodiment.

FIGS. 11A, 11B and 11C are top views to describe various examples of any one of the embossed patterns 50 described with reference to FIGS. 9, 10A and 10B. FIGS. 11A, 11B and 11C are top views in which one embossed pattern is added to the top view of FIG. 4, and the contents described in FIG. 4 will be omitted below, and it will be mainly described with reference to any one of the embossed patterns 50.

In an example, referring to FIG. 11A, any one embossed pattern 50 may include a first embossed portion 51a surrounded by a ring-shaped engraved pattern 47, and a second embossed portion 52 surrounding the one engraved pattern 47. The through-hole 43h may penetrate through the first embossed portion 51a. The embossed pattern 50 may be spaced apart from the engraved pattern 47.

The first embossed portion 51a may have a bar shape. For example, when the package overlapping region 10e' has a rectangular shape, the first embossed portion 51a may have a bar shape or a rectangular shape extending in the longitudinal direction of the package overlapping region 10e' or in the elongated direction.

In another example, referring to FIG. 11B, any one embossed pattern 50 may include a first embossed portion 51b surrounded by a ring-shaped engraved pattern 47, and a second embossed portion 52 surrounding the one engraved pattern 47. The first embossed portion 51b may include a first portion 51b_1 of a quadrangular shape, and second portions 51b_2 extending from corners of the first portion 51b_1 of the quadrangular shape toward corners of the engraved pattern 47 of the quadrangular ring shape.

In another example, referring to FIG. 11C, any one embossed pattern 50 may include a first embossed portion 51c surrounded by a ring-shaped engraved pattern 47, and a second embossed portion 52 surrounding the one engraved pattern 47. The second embossed portion 52 may be spaced apart from the engraved pattern 47, and the first embossed portion 51c may be connected to the engraved pattern 47. For example, the first embossed portion 51c may include a first portion 51c_1 spaced apart from the engraved pattern 47, and a second portion 51b_2 extending from the first portion 51c_1, having a width greater than that of the first portion 51c_1, and connected to the engraved pattern 47.

Figure 12:
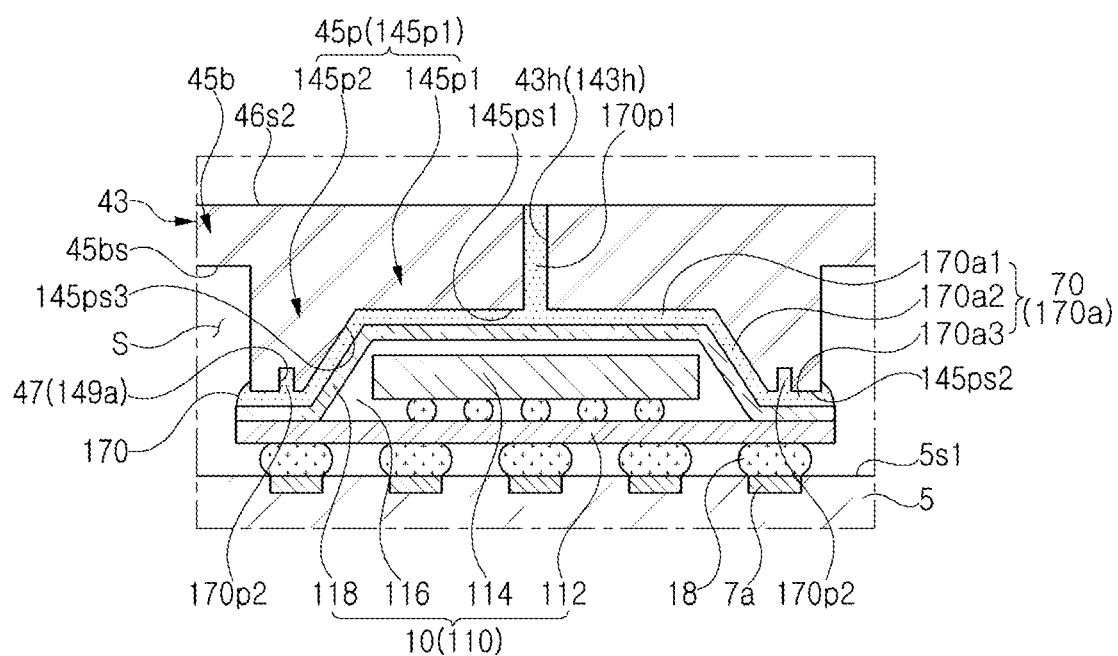
FIG. 12 is a diagram of another example of some components of an electronic device according to example embodiments.

Next, with reference to FIG. 12, a semiconductor package 110 that may replace any one of the semiconductor packages 10 of FIG. 1 or may be included in the semiconductor packages 10 will be described. FIG. 12 is a diagram schematically illustrating another example of some components of an electronic device according to example embodiments.

Referring to FIG. 12, a seventh semiconductor package 110 that may replace any one of the semiconductor packages 10 of FIG. 1 or may be included in the semiconductor packages 10 may be provided. The first to sixth semiconductor packages 10a, 10b, 10c, 20a, 20b, and 20c described with reference to FIG. 1 may have flat upper surfaces. In an example, the seventh semiconductor package 110 may replace any one of the first to sixth semiconductor packages 10a, 10b, 10c, 20a, 20b, and 20c having a flat upper surface.

The seventh semiconductor package 110 may include a package substrate 112, one or a plurality of semiconductor chips 114 mounted on the package substrate, an encapsulant 116 sealing the one or the plurality of semiconductor chips 114, on the package substrate 112, and a heat dissipation structure 118 covering the encapsulant 116, on the package substrate 112. The heat dissipation structure 118 may be formed of a metal material or a graphite material. In an example, the upper surface of the seventh semiconductor package 110 may include a center portion, an edge portion lower than the center portion, and an inclined portion between the center portion and the edge portion.

The first plate 43 may include a protruding region 145p1 that overlaps the seventh semiconductor package 110 and includes a center portion 145p1 and an edge portion 145p2 surrounding the center portion 145p1. The protruding region 145p1 of the first plate 43 may include a first protruding surface 145ps1 of the center portion 145p1, a second protruding surface 145ps2 of the edge portion 145p2, and an inclined surface 145ps3 between the first protruding surface 145ps1 and the second protruding surface 145ps2. The first protruding surface 145ps1, the second protruding surface 145ps2, and the inclined surface 145ps3 may constitute the first internal surface (43s1 in FIG. 1) of the first plate 43 described above.

The first plate 43 may further include a seventh engraved pattern 149a formed on the second protruding surface 145p2. The first plate 43 may further include a seventh through-hole 143h penetrating through the center portion 145p1 of the protruding region 145p1.

The plurality of thermal interface material layers 70 may include a seventh thermal interface material layer 170a between the first plate 43 and the seventh semiconductor package 110. The seventh thermal interface material layer 170a may include a first portion 170a1 covering the middle portion of the upper surface of the seventh semiconductor package 110, a second portion 170a2 covering the inclined portion of the upper surface of the seventh semiconductor package 110, and a third portion 170a3 covering the edge portion of the upper surface of the seventh semiconductor package 110.

The seventh thermal interface material layer 170a may further include a first portion 170p1 filling at least a portion of the seventh through-hole 143h, and a second portion 170p2 filling at least a portion of the seventh engraved pattern 149a.

Figure 13A:
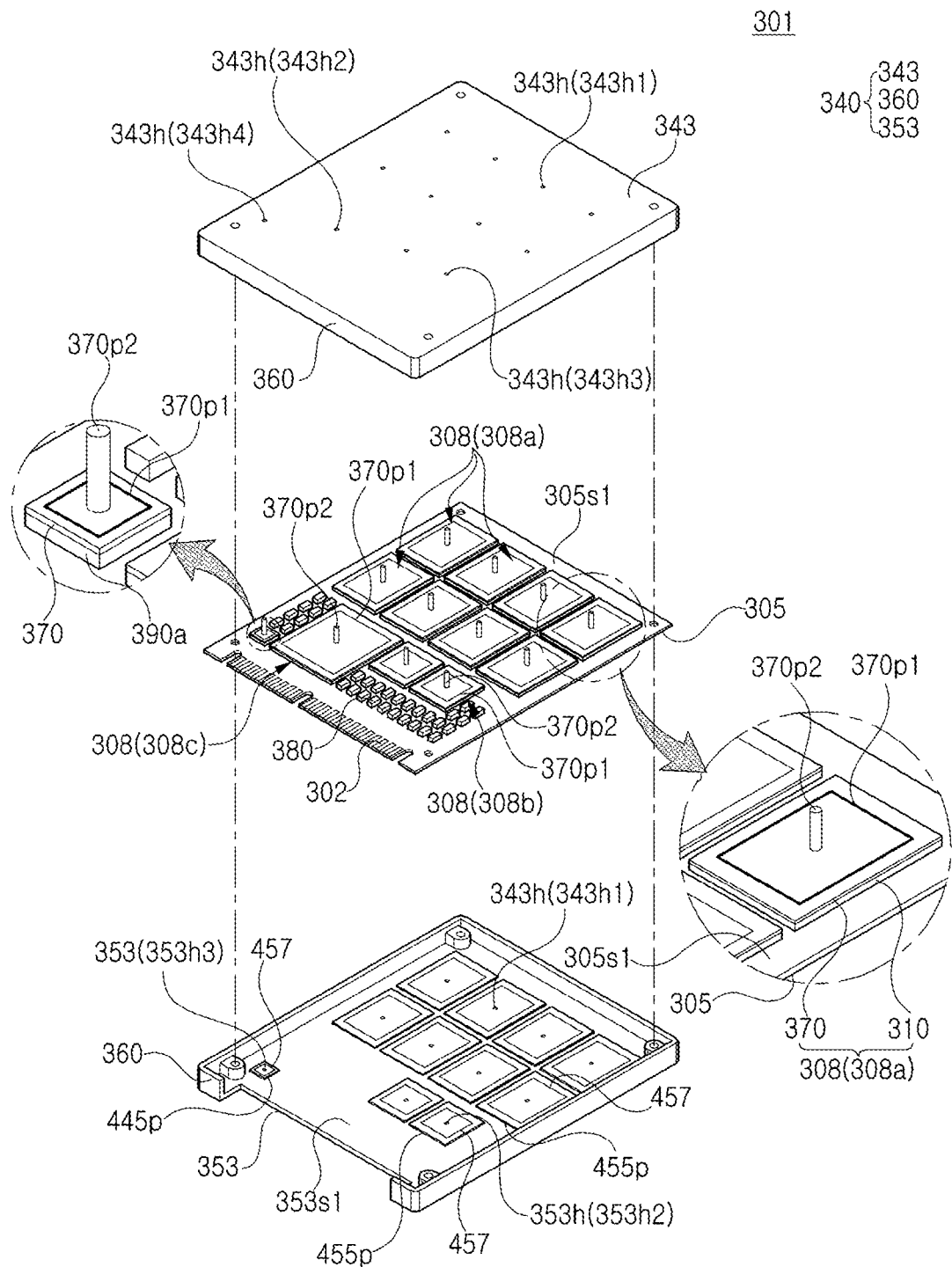
FIGS. 13A and 13B are schematic perspective views of an example of a storage device according to example embodiments.
Figure 13B:
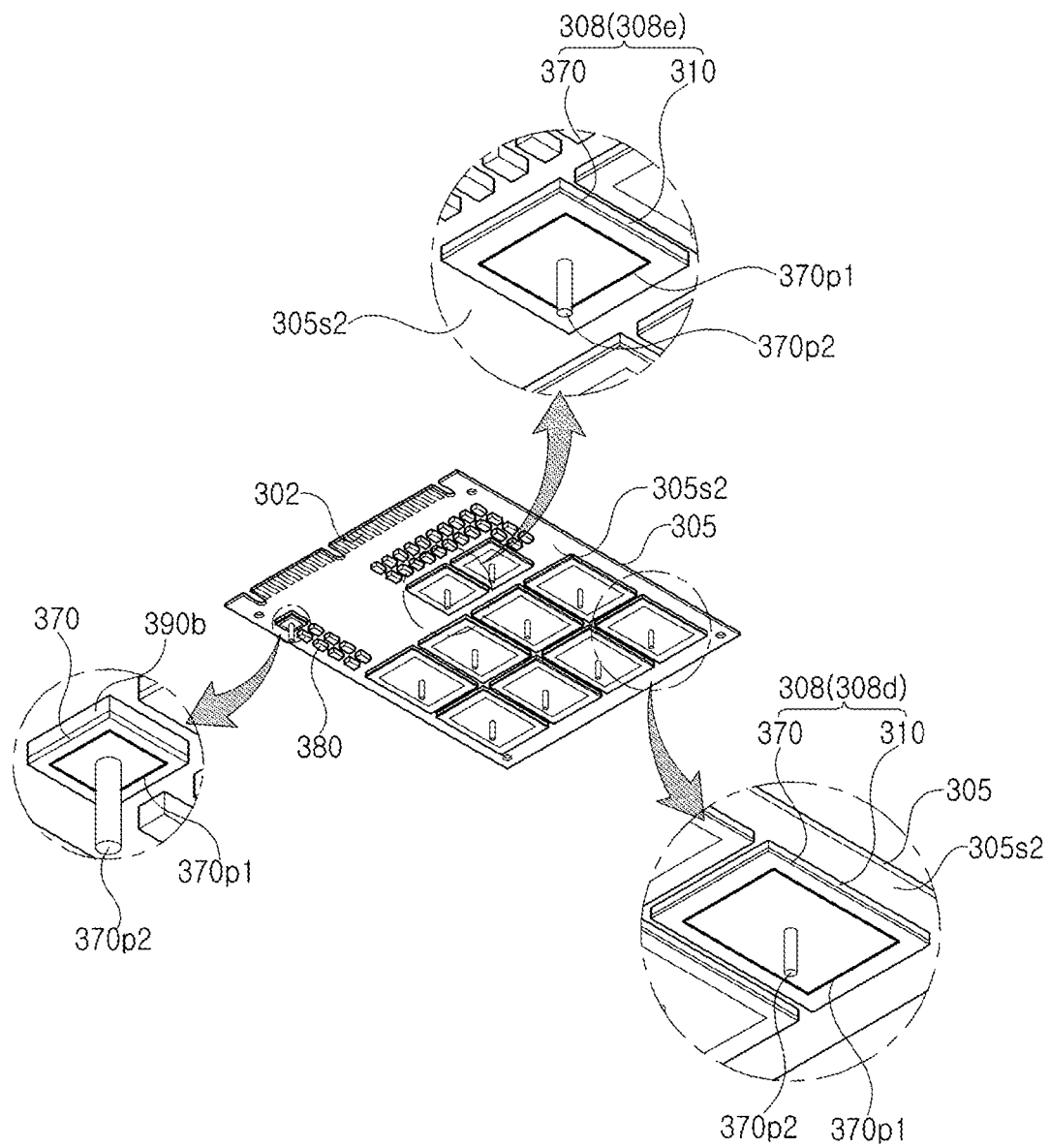

The electronic device 1 described above may include a storage device. An illustrative example of the storage device of the electronic device 1 will be described. FIGS. 13A and 13B are schematic perspective views illustrating an example of an electronic device according to example embodiments.

Referring to FIGS. 13A and 13B, an electronic device 301 may be a storage device, e.g., solid state drive device. The electronic device 301 may include a substrate 305 having a first surface 305s1 and a second surface 305s2 opposing each other, a plurality of packages 308, and a case 340.

The case 340 may be similar to the case 40 described with reference to FIG. 1. For example, the case 340 may include a first plate 343, a second plate 353, and a connecting portion 360 connecting the first and second plates 343 and 353. The first and second plates 343 and 353 may be formed of a material capable of dissipating heat, e.g., a metal material or a graphite material.

The first plate 343 may have a first internal surface facing the first surface 305$s$1 of the substrate 305, and a first external surface opposing the first internal surface. The first plate 343 may include a plurality of through-holes 343$h$. In the first plate 343, the plurality of through-holes 343$h$ may penetrate from the first internal surface to the first external surface. The plurality of through-holes 343$h$ may include a first through-hole 343$h$1, a second through-hole 343$h$2, a third through-hole 343$h$3, and a fourth through-hole 343$h$4.

The second plate 353 may have a second internal surface 353$s$1 facing the second surface 305$s$2 of the substrate 305, and a second external surface opposing the second internal surface 353$s$1. The second plate 353 may include a plurality of through-holes 353$h$. In the second plate 353, the plurality of through-holes 353$h$ may penetrate from the second internal surface 353$s$1 to the second external surface. In the second plate 353, the plurality of through-holes 353$h$ may include a fifth through-hole 353$h$1, a sixth through-hole 353$h$2, and a seventh through-hole 353$h$3.

The first and second plates 343 and 353 may include protruding regions 455$p$ and engraved patterns 357 that may correspond to the protruding regions 45$p$ and the engraved patterns 47 as described above, respectively.

Each of the plurality of packages 308 may include a semiconductor package 310 mounted on the substrate 305, and a thermal interface material layer 370 on the semiconductor package 310. The thermal interface material layers 370 may be substantially the same as the thermal interface material layers 70 described above.

Accordingly, each of the thermal interface material layers 370 may include a first portion 370$p$1 and a second portion 370$p$2, corresponding to the first portion (70$p$1 in FIG. 2A) and the second portion 70$p$2 of each of the thermal interface material layers 70 described above, respectively. In FIGS. 13A and 13B, portions denoted by reference numerals 370$p$1 and 370$p$2 may indicate that the semiconductor package is covered by the thermal interface material layer 370. The plurality of packages 308 may include front packages 308$a$, 308$b$, and 308$c$ disposed on the first surface 305$s$1 of the substrate 305. The front packages 308$a$, 308$b$, and 308$c$ may include first memory packages 308$a$, second memory packages 308$b$, and a control package 308$c$. The plurality of packages 308 may further include rear packages 308$d$ and 308$e$ disposed on the second surface 305$s$2 of the substrate 305. The rear packages 308$d$ and 308$e$ may include third memory packages 308$d$ of the same type as the first memory packages 308$a$, and fourth memory packages 308$e$ of the same type as the second memory packages 308$b$.

Each of the first memory packages 308$a$ may include a semiconductor package 310 that may be a first memory, and each of the second memory packages 308$b$ may include a semiconductor package 310 that may be a second memory. The control package 308$c$ may include a semiconductor package 310 that may be a controller. The control package 308$c$ may include a controller, and the first and third memory packages 308$a$ and 308$d$ may include a non-volatile memory for storing data under the control of the control package 308$c$. The first and third memory packages 308$a$ and 308$d$ may include a flash memory having a 2-dimensional (2D) structure or a 3-dimensional (3D) Vertical NAND (V-NAND) structure, but may also include other types of non-volatile memory, e.g., phase change random access memory (PRAM) and/or resistive random access memory (RRAM).

The second and fourth memory packages 308$b$ and 308$e$ may be buffer memories for mitigating a speed difference between external hosts of the first and third memory packages 308$a$ and 308$d$ serving as a data storage space. The second and fourth memory packages 308$b$ and 308$e$ may also operate as a kind of cache memory, and may also provide space for temporarily storing data in a control operation for the first and third memory packages 308$a$ and 308$d$. The second and fourth memory packages 308$b$ and 308$e$ may be volatile memories, e.g., DRAM.

The substrate 305 may include a connector 302 including a plurality of pins coupled to an external host. The number and the arrangement of the plurality of pins in the connector 302 may vary depending on a communication interface between the electronic device 301 and the external host. The electronic device 301 may operate by power supplied from an external host through the connector 302. The electronic device 301 may also further include power management integrated circuits (PMICs) 390$a$ and 390$b$ that distribute power supplied from the external host to the control semiconductor package 308$c$ and the first and second memory semiconductor packages 308$a$ and 308$b$. The PMICs 390$a$ and 390$b$ may be mounted on the first surface 305$s$1 and the second surface 305$s$2 of the substrate 305, respectively. Some of the thermal interface material layers 370 may cover an upper surface of each of the PMICs 390$a$ and 390$b$. The electronic device 301 may further include passive elements 380, e.g., a capacitor, mounted on the substrate 305.

Figure 14A:
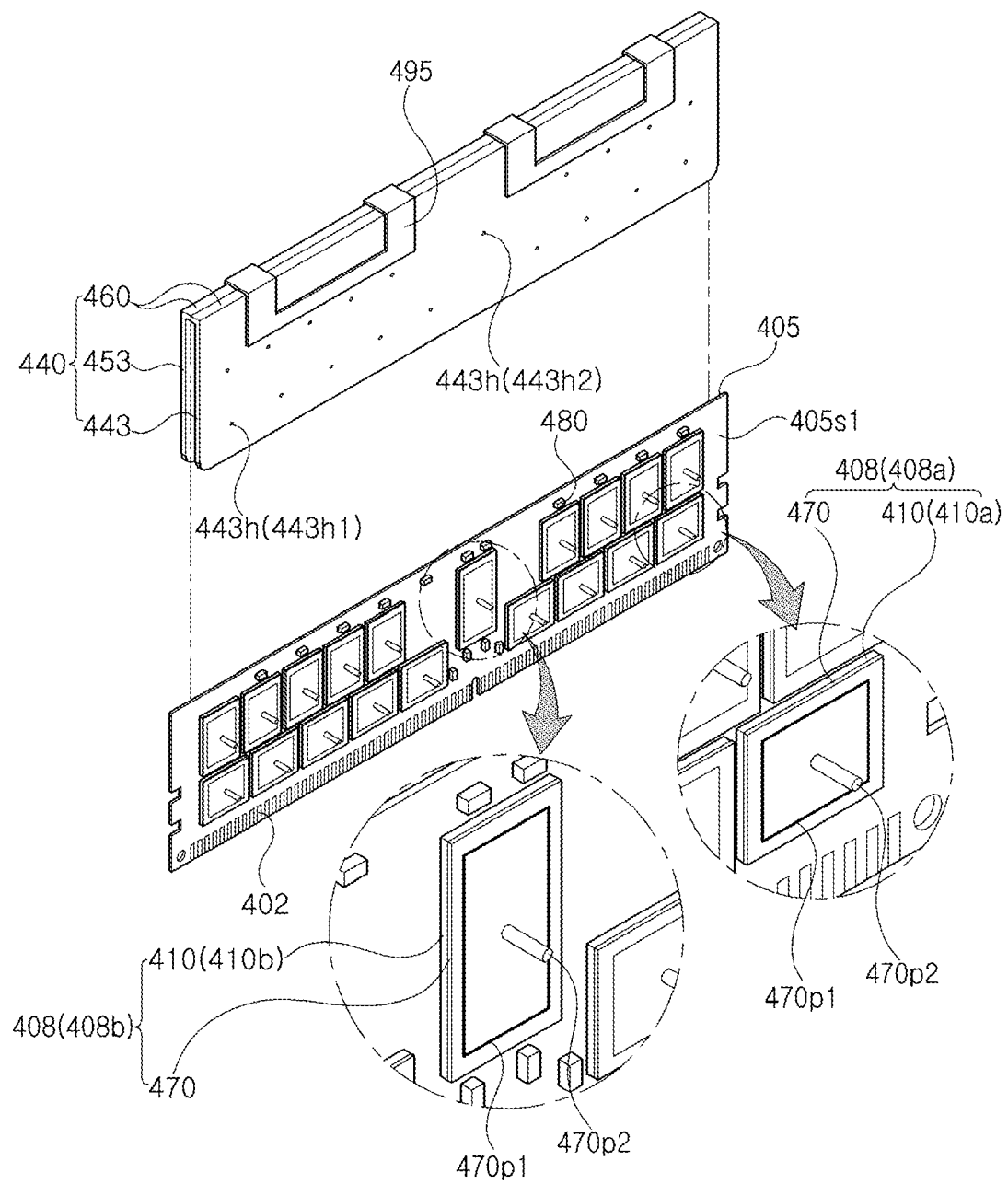
FIGS. 14A and 14B are schematic perspective views of another example of a storage device according to example embodiments.
Figure 14B:
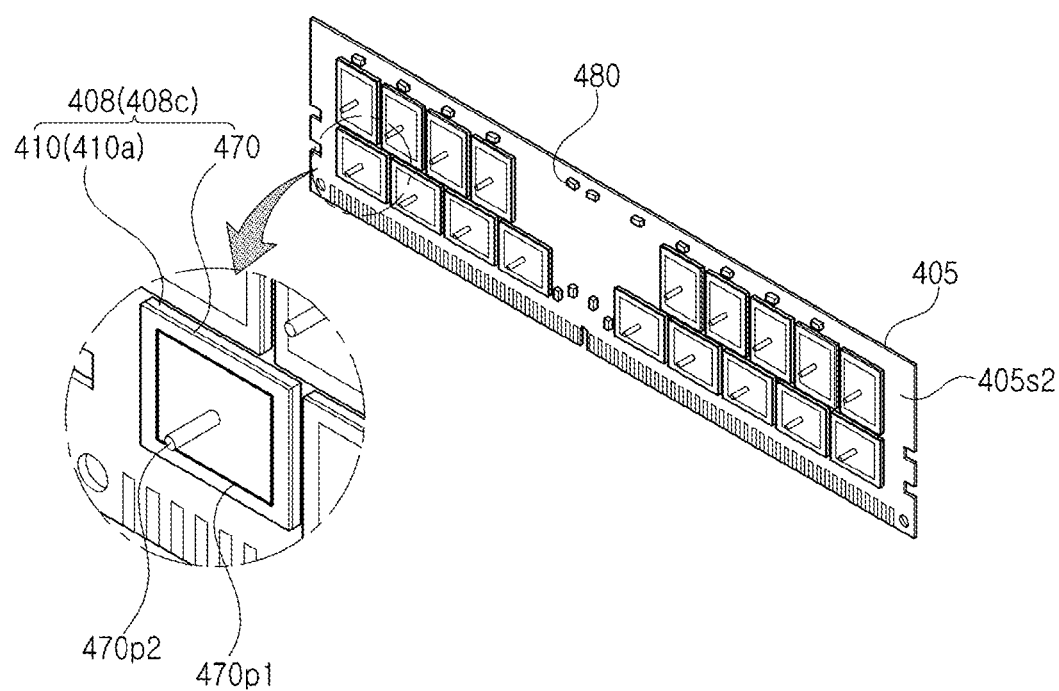

FIGS. 14A and 14B are schematic perspective views illustrating another example of an electronic device according to example embodiments.

Referring to FIGS. 14A and 14B, an electronic device 401 may be a memory module, e.g., a DRAM module. The electronic device 401 may include a substrate 405 having a first surface 405$s$1 and a second surface 405$s$2 opposing each other, a plurality of packages 408, and a heat dissipation case 440. The heat dissipation case 440 may be similar to the case 40 described with reference to FIG. 1. For example, the heat dissipation case 440 may include a first plate 443, a second plate 453, and a connection portion 460 connecting the first and second plates 443 and 453. The heat dissipation case 440 may further include a clamp 495 for fixing the first and second plates 443 and 453. The first and second plates 443 and 453 may be formed of a material capable of dissipating heat, e.g., a metal material or a graphite material.

The first plates 443 may have a first internal surface facing the first surface 405$s$1 of the substrate 405, and a first external surface opposing the first internal surface. The second plate 453 may have a second internal surface facing the second surface 405$s$2 of the substrate 405, and a second external surface opposing the second internal surface. The first and second plates 443 and 453 may include a plurality of through-holes 443$h$. The first and second plates 443 and 453 may include protruding regions and engraved patterns, corresponding to the protruding regions 45$p$ and the engraved patterns 47 as described above, respectively.

Each of the plurality of packages 408 may include a semiconductor package 410 mounted on the substrate 405, and a thermal interface material layer 470 on the semiconductor package 410. The thermal interface material layers 470 may be substantially the same as the thermal interface material layers 70 described above. Accordingly, each of the thermal interface material layers 470 may include a first portion 4'70p1 and a second portion 470p2, corresponding to the first portion (70p1 in FIG. 2A) and the second portion 70p2 of each of the thermal interface material layers 70 described above, respectively. In FIGS. 14A and 14B, portions indicated by reference numerals 4'70p1 and 470p2 may mean that the semiconductor package is covered by the thermal interface material layer 470. The electronic device 401 may further include passive elements 480, e.g., a capacitor, mounted on the substrate 405. The plurality of packages 408 may include first packages 408a and a second package 408b disposed on the first surface 405s1 of the substrate 405, and third packages 408c disposed on the second surface 405s2 of the substrate 405.

Each of the first packages 408a may include a first memory semiconductor package 410a, and a first thermal interface material layer 470a covering the upper surface of the first memory semiconductor package 410a, the second package 408b may include a control semiconductor package 410b, and a second thermal interface material layer 470b covering the upper surface of the control semiconductor package 410b, and the third package 408c may include a second memory semiconductor package 410c, and a third thermal interface material layer 470c covering the upper surface of the second memory semiconductor package 410c. The first and second memory semiconductor packages 408a and 408c may be DRAMs, and the control semiconductor package 408b may be a register or a controller capable of controlling the first and second memory semiconductor packages 408a and 408c.

Figure 15:
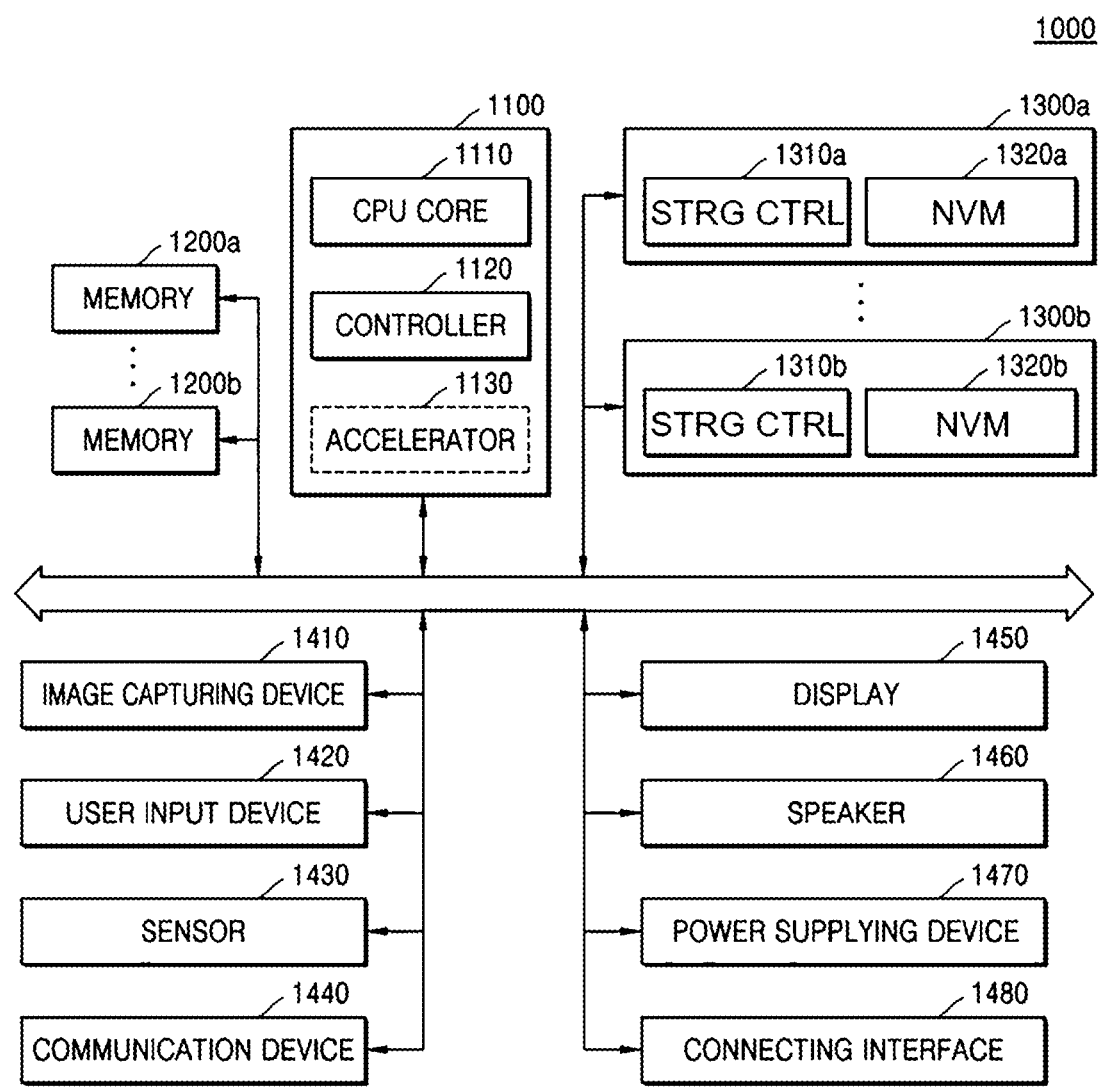
FIG. 15 is a diagram of a system to which an electronic device according to an example embodiment is applied.

FIG. 15 is a diagram illustrating a system 1000 to which an electronic device according to an example embodiment is applied. The system 1000 of FIG. 15 may basically be a mobile system, e.g., a portable communication terminal (e.g., a mobile phone), a smartphone, a tablet personal computer (PC), a wearable device, a healthcare device, or an Internet of things (IOT) device. However, the system 1000 of FIG. 15 is not necessarily limited to the mobile system, and may be a personal computer (PC), a laptop computer, a server, a media player, an automotive device, e.g., a navigation device, or the like.

Referring to FIG. 15, the system 1000 may include a main processor 1100, memories 1200a and 1200b, and storage devices 1300a and 1300b. In addition, the system 1000 may include at least one of an image capturing device 1410, a user input device 1420, a sensor 1430, a communication device 1440, a display 1450, a speaker 1460, a power supplying device 1470, and a connecting interface 1480.

The storage devices 1300a and 1300b may be the electronic devices 301 illustrated in FIGS. 13A and 13B. The memories 1200a and 1200b may be memory modules of the electronic device 401 as illustrated in FIGS. 14A and 14B. Accordingly, at least one of the storage devices 1300a and 1300b and the memories 1200a and 1200b may be an electronic device according to any one of the example embodiments described with reference to FIGS. 1 to 14B.

The main processor 1100 may control overall operations of the system 1000, in more detail, operations of other components included in the system 1000. The main processor 1100 may be implemented as a general-purpose processor, a dedicated processor, or an application processor.

The main processor 1100 may include at least one central processing unit (CPU) core 1110 and further include a controller 1120 configured to control the memories 1200a and 1200b and/or the storage devices 1300a and 1300b. In some embodiments, the main processor 1100 may further include an accelerator 1130, which is a dedicated circuit for a high-speed data operation, e.g., an artificial intelligence (AI) data operation. The accelerator 1130 may include a graphics processing unit (GPU), a neural processing unit (NPU) and/or a data processing unit (DPU) and be implemented as a chip that is physically separate from the other components of the main processor 1100.

The memories 1200a and 1200b may be used as main memory devices of the system 1000. Although the memories 1200a and 1200b may include a volatile memory, e.g., static random access memory (SRAM) and/or DRAM, the memories 1200a and 1200b may also include a non-volatile memory, e.g., a flash memory, PRAM and/or RRAM. The memories 1200a and 1200b may also be implemented in the same package as that of the main processor 1100.

The storage devices 1300a and 1300b may serve as non-volatile storage devices configured to store data regardless of whether power is supplied thereto, and have larger storage capacity than the memories 1200a and 1200b. The storage devices 1300a and 1300b may include storage controllers 1310a and 1310b, and NonVolatile Memories (NVMs) 1320a and 1320b storing data under the control of the storage controllers 1310a and 1310b. Although the NVMs 1320a and 1320b may include V-NAND flash memories having a two-dimensional (2D) structure or a three-dimensional (3D) structure, the NVMs 1320a and 1320b may include other types of NVMs, e.g., PRAM and/or RRAM. For example, in the storage devices 1300a and 1300b, the non-volatile memories 1320a and 1320b may be the first and third memory semiconductor packages 308a and 308d described with reference to FIGS. 13A and 13B, and the storage controllers 1310a and 1310b may be the control semiconductor package 308e.

The storage devices 1300a and 1300b may be physically separated from the main processor 1100 and included in the system 1000 or may also be implemented in the same package as the main processor 1100. In addition, the storage devices 1300a and 1300b may have types of solid-state devices (SSDs) as those described in FIGS. 13A and 13B, and be removably combined with other components of the system 1000 through an interface, e.g., a connecting interface 1480, to be described below. The storage devices 1300a and 1300b may be devices to which a standard protocol, e.g., a universal flash storage (UFS), an embedded multi-media card (eMMC), or a non-volatile memory express (NVMe), is applied, without being limited thereto.

The image capturing device 1410 may capture still images or moving images. The image capturing device 1410 may include a camera, a camcorder, and/or a webcam.

The user input device 1420 may receive various types of data input by a user of the system 1000 and include a touch pad, a keypad, a keyboard, a mouse, and/or a microphone.

The sensor 1430 may detect various types of physical quantities, which may be obtained from the outside of the system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the system 1000 according to various communication protocols. The communication device 1440 may be implemented to include an antenna, a transceiver, and/or a modem.

The display 1450 and the speaker 1460 may serve as output devices configured to respectively output visual information and auditory information to the user of the system 1000.

The power supplying device 1470 may appropriately convert power supplied from a battery embedded in the system 1000 and/or an external power source, and supply the converted power to each of components of the system 1000.

The connecting interface 1480 may provide connection between the system 1000 and an external device, which is connected to the system 1000 and capable of transmitting and receiving data to and from the system 1000. The connecting interface 1480 may be implemented by using various interface schemes, e.g., advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

Figure 16:
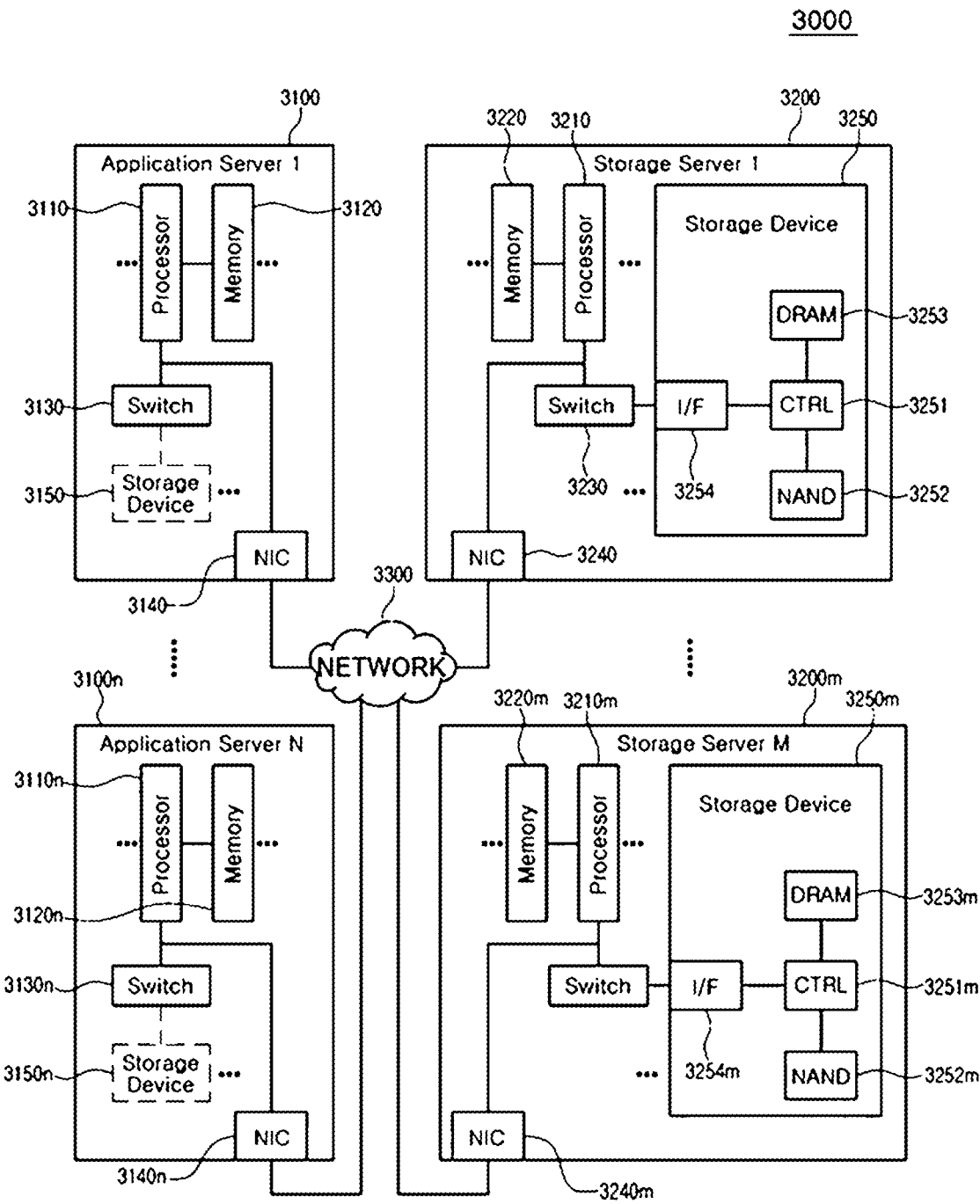
FIG. 16 is a diagram of a data center to which a memory device according to an example embodiment is applied.

Referring to FIG. 16, a data center 3000 is a facility that collects various types of data and provides services, and may also be referred to as a data storage center. The data center 3000 may be a system for operating a search engine and a database, and may be a computing system used in a business, e.g., a bank or a government institution. The data center 3000 may include application servers 3100 to 3100*n* and storage servers 3200 to 3200*m*. The number of application servers 3100 to 3100*n* and the number of storage servers 3200 to 3200*m* may be variously selected according to an example embodiment, and the number of application servers 3100 to 3100*n* and the storage servers 3200 to 3200*m* may be different.

The application server 3100 or the storage server 3200 may include at least one of processors 3110 and 3210 and memories 3120 and 3220. Describing the storage server 3200 as an example, the processor 3210 may control the overall operation of the storage server 3200, and access the memory 3220 to execute instructions and/or data loaded into the memory 3220. The memory 3220 may be Double Data Rate (DDR) Synchronous DRAM (SDRAM), High Bandwidth Memory (HBM), Hybrid Memory Cube (HMC), Dual In-line Memory Module (DIMM), Optane DIMM, and/or Non-Volatile DIMM (NVMDIMM). According to an example embodiment, the number of processors 3210 and the number of memories 3220 included in the storage server 3200 may be variously selected. In an example embodiment, the processor 3210 and memory 3220 may provide a processor-memory pair. In an example embodiment, the numbers of processors 3210 and memory 3220 may also be different from each other. The processor 3210 may include a single-core processor or a multi-core processor. The above description of the storage server 3200 may be similarly applied to the application server 3100. According to an example embodiment, the application server 3100 may not include the storage device 3150. The storage server 3200 may include at least one storage device 3250. The number of storage devices 3250 included in the storage server 3200 may be variously selected according to example embodiments.

The application servers 3100 to 3100*n* and the storage servers 3200 to 3200*m* may communicate with each other through a network 3300. The network 3300 may be implemented using Fiber Channel (FC) or Ethernet. In this case, FC is a medium used for relatively high-speed data transmission, and may use an optical switch providing high performance/high availability. Depending on the access method of the network 3300, the storage servers 3200 to 3200*m* may be provided as file storage, block storage, or object storage.

In an example embodiment, the network 3300 may be a storage-only network, e.g., a storage area network (SAN). For example, the SAN may be an FC-SAN that uses an FC network and is implemented according to FC Protocol (FCP). As another example, the SAN may be an IP-SAN that uses a TCP/IP network and is implemented according to the iSCSI (SCSI over TCP/IP or Internet SCSI) protocol. In other embodiments, the network 3300 may be a generic network, e.g., a TCP/IP network. For example, the network 3300 may be implemented according to protocols, e.g., FC over Ethernet (FCoE), Network Attached Storage (NAS), and NVMe over Fabrics (NVMe-oF).

Hereinafter, the application server 3100 and the storage server 3200 will be mainly described. A description of the application server 3100 may be applied to other application servers 3100*n*, and a description of the storage server 3200 may also be applied to other storage servers 3200*m*.

The application server 3100 may store data requested to be stored by a user or a client in one of the storage servers 3200 to 3200*m* through the network 3300. Also, the application server 3100 may obtain data to be read, requested by the user or the client, from one of the storage servers 3200 to 3200*m* through the network 3300. For example, the application server 3100 may be implemented as a web server or Database Management System (DBMS).

The application server 3100 may access the memory 3120*n* or storage device 3150*n* included in another application server 3100*n* through the network 3300, or may access the memories 3220-3220*m* or storage devices 3250-3250*m* included in the storage servers 3200-3200*m* through the network 3300. Accordingly, the application server 3100 may perform various operations on data stored in the application servers 3100-3100*n* and/or the storage servers 3200-3200*m*. For example, the application server 3100 may execute a command for moving or copying data between the application servers 3100-3100*n* and/or the storage servers 3200-3200*m*. In this case, data may be transferred to the memory 3120-3120*n* of the application servers 3100-3100*n* from the storage devices 3250-3250*m* of the storage servers 3200-3200*m* via the memories 3220-3220*m* of the storage servers 3200-3200*m*, or may be moved directly to the memories 3120-3120*n* of the application servers 3100-3100*n*. The data moving through the network 3300 may be encrypted data for security or privacy.

Describing the storage server 3200 as an example, an interface 3254 may provide a physical connection between the processor 3210 and a controller 3251 and a physical connection between a Network InterConnect (NIC) 3240 and the controller 3251. For example, the interface 3254 may be implemented in a Direct Attached Storage (DAS) method for directly connecting the storage device 3250 with a dedicated cable. Also, e.g., the interface 3254 may be implemented in various interface methods, e.g., an Advanced Technology Attachment (ATA), Serial ATA (SATA), external SATA (e-SATA), Small Computer Small Interface (SCSI), Serial Attached SCSI (SAS), Peripheral Component Interconnection ((PCI)), PCI express (PCIe), NVM express (NVMe), IEEE 1394, universal serial bus (USB), secure digital (SD) card, multi-media card (MMC), embedded multi-media card (eMMC), a universal flash storage (UFS), an embedded universal flash storage (eUFS), and/or a compact flash (CF) card interface.

The storage server 3200 may further include a switch 3230 and a network interface card (NIC) 3240. The switch 3230 may selectively connect the processor 3210 and the storage device 3250 or selectively connect the NIC 3240 and the storage device 3250 under the control of the processor 3210.

In an example embodiment, the NIC 3240 may include a network interface card, a network adapter, and the like. The NIC 3240 may be connected to the network 3300 by a wired interface, a wireless interface, a Bluetooth interface, an optical interface, or the like. The NIC 3240 may include an internal memory, a digital signal processor (DSP), a host bus interface, and the like, and may be connected to the processor 3210 and/or the switch 3230 through the host bus interface. The host bus interface may be implemented as one of the examples of the interface 3254 described above. In an example embodiment, the NIC 3240 may be integrated with at least one of the processor 3210, the switch 3230, and the storage device 3250.

In the storage servers 3200-3200m or the application servers 3100-3100n, the processor sends a command to the storage devices 3150-3150n and 3250-3250m or the memories 3120-3120n and 3220-3220m to program or read the data. In this case, the data may be error-corrected data through an Error Correction Code (ECC) engine. The data is data that has been processed by Data Bus Inversion (DBI) or Data Masking (DM), and may include Cyclic Redundancy Code (CRC) information. The data may be encrypted data for security or privacy.

The storage devices 3150-3150n and 3250-3250m may transmit a control signal and a command/address signal to the NAND flash memory devices 3252-3252m in response to a read command received from the processor. Accordingly, when data is read from the NAND flash memory devices 3252-3252m, a read enable (RE) signal may be input as a data output control signal to output data to the DQ bus. A data strobe (DQS) may be generated using the RE signal. The command and address signals may be latched in the page buffer according to a rising edge or a falling edge of a write enable (WE) signal.

The controller 3251 may control overall operations of the storage device 3250. In an example embodiment, the controller 3251 may include a static random access memory (SRAM). The controller 3251 may write data to the NAND flash 3252 in response to a write command, or may read data from the NAND flash 3252 in response to a read command. For example, a write command and/or a read command may be provided from a processor 3210 in the storage server 3200, a processor 3210m in another storage server 3200m, or processors 3110 and 3110n in application servers 3100 and 3100n. The DRAM 3253 may temporarily store (buffer) data to be written to the NAND flash 3252 or data read from the NAND flash 3252. Also, the DRAM 3253 may store metadata. In this case, the metadata is user data or data generated by the controller 3251 to manage the NAND flash 3252. The storage device 3250 may include a Secure Element (SE) for security or privacy.

The storage devices 3150-3150n and 3250-3250m may be the storage devices according to the above-described embodiments, e.g., the electronic device 301 of FIGS. 13A and 13B. For example, in the storage devices 3150-3150n and 3250-3250m, the NANDs 3252-3252m may be the first and third memory semiconductor packages 308a and 308d described with reference to FIGS. 13A and 13B, and the controllers 3251-3251m may be the control semiconductor package 308e described with reference to FIGS. 13A and 13B, and the DRAMs 3253-3253m may be the second and fourth memory semiconductor packages 308b and 308e described with reference to FIGS. 13A and 13B.

By way of summation and review, example embodiments provide an electronic device in which heat dissipation characteristics may be improved. That is, according to example embodiments, an electronic device including thermal interface material layers between a plurality of semiconductor packages and a plate may be provided. The thermal interface material layers may be formed by being injected as a liquid through through-holes of the plate and being then cured. In addition, a pattern disposed on the internal surface of the plate, e.g., an engraved pattern, may prevent a liquid thermal interface material from flowing to a side surface of the semiconductor package. The electronic device including a plurality of semiconductor packages, a plate, and thermal interface material layers as described above may more effectively dissipate heat.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An electronic device, comprising:
   a substrate having a first surface and a second surface that are opposite to each other;
   a first plate having a first internal surface facing the first surface of the substrate, and a first external surface that is opposite to the first internal surface, the first plate including at least one first through-hole and at least one second through-hole;
   a first semiconductor package and a second semiconductor package on the first surface of the substrate, the first semiconductor package and the second semiconductor package being between the first surface of the substrate and the first internal surface of the first plate, and the first semiconductor package and the second semiconductor package being spaced apart from each other;
   a first thermal interface material layer between the first semiconductor package and the first plate, the first thermal interface material layer contacting an upper surface of the first semiconductor package and the first internal surface of the first plate, and the first thermal interface material layer filling at least a portion of the at least one first through-hole; and
   a second thermal interface material layer between the second semiconductor package and the first plate, the second thermal interface material layer contacting an upper surface of the second semiconductor package and the first internal surface of the first plate, and the second thermal interface material layer filling at least a portion of the at least one second through-hole,
   wherein at least one of a side surface of the first thermal interface material layer and a side surface of the second thermal interface material layer is exposed to an empty space between the first internal surface of the first plate and the first surface of the substrate.

2. The electronic device as claimed in claim 1, wherein:
   the first plate has:

a base region having a base surface at a first height level from the first surface of the substrate, and a first protruding region having a first protruding surface at a second height level from the first surface of the substrate, the second height level being smaller than the first height level, the first internal surface of the first plate includes the base surface and the first protruding surface, the first protruding region overlaps the first semiconductor package, and at least a portion of the first thermal interface material layer is in contact with the first protruding surface and the upper surface of the first semiconductor package.

3. The electronic device as claimed in claim 2, wherein, when viewed from above, an edge of the first protruding region is surrounded by an edge of the first semiconductor package.

4. The electronic device as claimed in claim 2, wherein the first thermal interface material layer further includes a portion covering at least a part of a side surface of the first protruding region.

5. The electronic device as claimed in claim 2, wherein:
the first plate further includes a second protruding region having a second protruding surface at a level lower than the first protruding surface and overlapping the second semiconductor package, and at least a portion of the second thermal interface material layer is in contact with the second protruding surface and the upper surface of the second semiconductor package.

6. The electronic device as claimed in claim 5, wherein:
the first plate further includes a first engraved pattern recessed from a portion of the first protruding surface in a direction away from the first surface of the substrate, and a second engraved pattern recessed from a portion of the second protruding surface in a direction away from the first surface of the substrate, the first thermal interface material layer fills at least a part of the first engraved pattern, and the second thermal interface material layer fills at least a part of the second engraved pattern.

7. The electronic device as claimed in claim 6, wherein the first engraved pattern has a closed loop shape, the at least one first through-hole being surrounded by the closed loop shape of the first engraved pattern.

8. The electronic device as claimed in claim 6, wherein a distance between an edge of the first protruding region and the first engraved pattern is less than a distance between a center of the first protruding region and the first engraved pattern.

9. The electronic device as claimed in claim 1, wherein the first plate further includes an embossed pattern overlapping the first semiconductor package and spaced apart from the first semiconductor package, the embossed pattern having a shape protruding from the first internal surface of the first plate toward the first surface of the substrate.

10. The electronic device as claimed in claim 1, wherein the first thermal interface material layer is in contact with at least a portion of an edge of the upper surface of the first semiconductor package.

11. The electronic device as claimed in claim 1, wherein:
the second semiconductor package has a thickness different from a thickness of the first semiconductor package, and a lower surface of the first thermal interface material layer and a lower surface of the second thermal interface material layer are at different height levels relative to the first surface of the substrate.

12. The electronic device as claimed in claim 1, wherein at least a portion of the side surface of the first thermal interface material layer is curved.

13. The electronic device as claimed in claim 1, further comprising:
a second plate having a second internal surface facing the second surface of the substrate, and a second external surface that is opposite to opposing the second internal surface, the second plate including a rear through-hole;

a rear semiconductor package below the second surface of the substrate, the rear semiconductor package being between the second surface of the substrate and the second internal surface of the second plate; and a rear thermal interface material layer in contact with the second internal surface of the second plate and the rear semiconductor package, the rear thermal interface material layer filling at least a portion of the rear through-hole, and a side surface of the second thermal interface material layer being exposed to an empty space between the second internal surface of the second plate and the second surface of the substrate.

14. An electronic device, comprising:
a substrate having a first surface and a second surface, that are opposite to each other;

a first plate having a first internal surface facing the first surface of the substrate, and a first external surface that is opposite to the first internal surface, the first plate including a plurality of front through-holes;

a plurality of front semiconductor packages on the first surface of the substrate and spaced apart from each other, the plurality of front semiconductor packages being between the first surface of the substrate and the first internal surface of the first plate; and a plurality of front thermal interface material layers in contact with the first internal surface of the first plate and each of the plurality of front semiconductor packages, the plurality of front thermal interface material layers being between the plurality of front semiconductor packages and the first internal surface of the first plate, wherein:
the plurality of front semiconductor packages include a first front semiconductor package and a second front semiconductor package having different thicknesses, the plurality of front through-holes include at least one first front through-hole overlapping the first front semiconductor package and at least one second front through-hole overlapping the second front semiconductor package, the plurality of front thermal interface material layers include a first front thermal interface material layer in contact with the first plate and the first front semiconductor package, and a second front thermal interface material layer in contact with the first plate and the second front semiconductor package, the first plate includes a base region having a base surface at a first height level from the first surface of the substrate, and a first protruding region having a first protruding surface at a second height level lower than the first height level relative to the first surface of the substrate, and overlapping the first front semiconductor package, the first internal surface includes the base surface and the first protruding surface, and the first front thermal interface material layer is in contact with the first protruding surface of the first protruding region.

15. The electronic device as claimed in claim 14, wherein:
the first plate further includes a second protruding region having a second protruding surface at a third height level, lower than the first height level, from the first surface of the substrate, and overlapping the second front semiconductor package, and
the second front thermal interface material layer is in contact with the second protruding surface of the second protruding region.

16. The electronic device as claimed in claim 14, further comprising:
a second plate having a second internal surface facing the second surface of the substrate, and a second external surface that is opposite to opposing the second internal surface, the second plate having a plurality of rear through-holes;
a plurality of rear semiconductor packages respectively mounted on the second surface of the substrate, between the second surface of the substrate and the second internal surface of the second plate, and overlapping the plurality of rear through-holes; and
a plurality of rear thermal interface material layers in contact with the second internal surface of the second plate and each of the plurality of rear semiconductor packages, and between the plurality of rear semiconductor packages and the second internal surface of the second plate.

17. The electronic device as claimed in claim 14, wherein:
the first plate further includes a first engraved pattern and a second engraved pattern, each of the first engraved pattern and the second engraved pattern being recessed from the first internal surface in a direction away from the first surface of the substrate,
the first front thermal interface material layer fills at least a portion of the first engraved pattern, and
the second front thermal interface material layer fills at least a portion of the second engraved pattern.

18. The electronic device as claimed in claim 14, wherein:
the first front thermal interface material layer fills at least a portion of the at least one first front through-hole,
the second front thermal interface material layer fills at least a portion of the at least one second front through-hole, and each of the plurality of front semiconductor packages includes a package substrate, at least one semiconductor chip on the package substrate, and an encapsulant covering the at least one semiconductor chip on the package substrate.

19. An electronic device, comprising:
a substrate having a first surface and a second surface that are opposite to each other;
a plate having an internal surface facing the first surface of the substrate, and an external surface that is opposite to the internal surface, the plate including at least one through-hole;
a semiconductor package overlapping the at least one through-hole and mounted on the first surface of the substrate, between the first surface of the substrate and the internal surface of the plate; and
a thermal interface material layer filling at least a portion of the at least one through-hole and in contact with the semiconductor package and the plate,
wherein:
the plate includes a package overlap region overlapping the semiconductor package,
the internal surface of the plate at the package overlap region of the plate includes a bottommost surface of the plate at the package overlap region, wherein the bottommost surface of the plate at the package overlap region includes a first region and a second region at different height levels in the package overlap region, the first region and the second region being in contact with the thermal interface material layer, and
a side surface of the thermal interface material layer is exposed in an empty space between the internal surface of the plate and the first surface of the substrate.

20. The electronic device as claimed in claim 19, wherein:
the plate further includes a base region having a base surface at a first height level from the first surface of the substrate, a protruding region having a protruding surface at a second height level lower than the first height level, and an engraved pattern recessed from the protruding surface in a direction away from the first surface of the substrate, and
the thermal interface material layer contacts the protruding surface and fills at least a portion of the engraved pattern.

* * * * *